(12) United States Patent
Hildreth

(10) Patent No.: US 9,809,882 B2
(45) Date of Patent: Nov. 7, 2017

(54) ARTICLE AND PROCESS FOR SELECTIVE DEPOSITION

(71) Applicant: NATIONAL INSTITUTE OF STANDARDS AND TECHNOLOGY, Gaithersburg, MD (US)

(72) Inventor: Owen Hildreth, Pacific Grove, CA (US)

(73) Assignee: The United States of America, as represented by the Secretary of Commerce, Washington, DC (US)

( * ) Notice: Subject to any disclaimer, the term of this patent is extended or adjusted under 35 U.S.C. 154(b) by 0 days.

(21) Appl. No.: 14/596,355

(22) Filed: Jan. 14, 2015

(65) Prior Publication Data
US 2015/0126031 A1 May 7, 2015

Related U.S. Application Data

(60) Provisional application No. 61/928,090, filed on Jan. 16, 2014.

(51) Int. Cl.
*H01L 21/285* (2006.01)
*H01L 21/306* (2006.01)
(Continued)

(52) U.S. Cl.
CPC ...... *C23C 18/1608* (2013.01); *C23C 18/1879* (2013.01); *C23C 18/31* (2013.01);
(Continued)

(58) Field of Classification Search
CPC ............. H01L 21/28506; H01L 21/306; H01L 21/31111; H01Q 17/007; C23C 14/04;
(Continued)

(56) References Cited

U.S. PATENT DOCUMENTS 8,278,191 B2 10/2012 Hildreth
8,314,022 B1 * 11/2012 Foster ............... H01L 21/31111
257/E21.219
(Continued)

OTHER PUBLICATIONS

Huang et al., Advanced Materials, Metal-Assisted Chemical Etching of Silicon: A Review XX,1-24 (2010).
(Continued)

*Primary Examiner* — Johannes P Mondt
(74) *Attorney, Agent, or Firm* — Toby D. Hain

(57) ABSTRACT

A process for depositing a metal includes disposing an activating catalyst on a substrate; contacting the activating catalyst with a metal cation from a vapor deposition composition; contacting the substrate with a reducing anion from the vapor deposition composition; performing an oxidation-reduction reaction between the metal cation and the reducing anion in a presence of the activating catalyst; and forming a metal from the metal cation to deposit the metal on the substrate. A system for depositing a metal includes an activating catalyst to deposit on a substrate; and a primary reagent to form: a metal cation to deposit on the substrate as a metal; and a reducing anion to provide electrons to the activating catalyst, the metal cation, the substrate, or a combination thereof, wherein the primary reagent forms the metal cation and the reducing anion in response to being subjected to a dissociating condition.

19 Claims, 20 Drawing Sheets

(51) Int. Cl.
    *C23C 18/18* (2006.01)
    *C23C 18/16* (2006.01)
    *C23C 18/31* (2006.01)
    *H01Q 17/00* (2006.01)
    *C25F 3/12* (2006.01)

(52) U.S. Cl.
    CPC .......... *C25F 3/12* (2013.01); *H01L 21/28506* (2013.01); *H01L 21/306* (2013.01); *H01Q 17/00* (2013.01)

(58) Field of Classification Search
    CPC ..... C23C 14/06; C23C 14/22; C23C 18/1879; C23C 18/1608; C23C 18/31; C25F 3/12
    USPC .................. 438/680, 681, 694, 703; 106/1.05
    See application file for complete search history.

(56) References Cited

U.S. PATENT DOCUMENTS

| | | | | |
|---|---|---|---|---|
| 2005/0106318 A1* | 5/2005 | Partridge | .............. | C23C 16/045 427/248.1 |
| 2006/0223300 A1* | 10/2006 | Simka | .................... | C23C 16/18 438/618 |
| 2010/0014888 A1* | 1/2010 | Ikeda | .................. | G03G 5/0433 399/159 |
| 2010/0071587 A1* | 3/2010 | Byun | ..................... | C07F 1/005 106/1.18 |
| 2010/0166981 A1* | 7/2010 | Dominguez | ............ | C23C 16/18 427/576 |
| 2010/0248449 A1* | 9/2010 | Hildreth | .............. | B81C 1/00071 438/460 |

OTHER PUBLICATIONS

C.P. Wong, Awardees and Performing Research Organization Program Announcement/Solicitation/Description No. NSF Unit of Consideration: (Feb. 2009).

Hildreth et al., Advanced Functional Materials, Vapor Phase Metal-Assisted Chemical Etching of Silicon (2014).

Huang et al., Nanotechnology, Metal-assisted electrochemical etching of silicon 21 (2010).

* cited by examiner

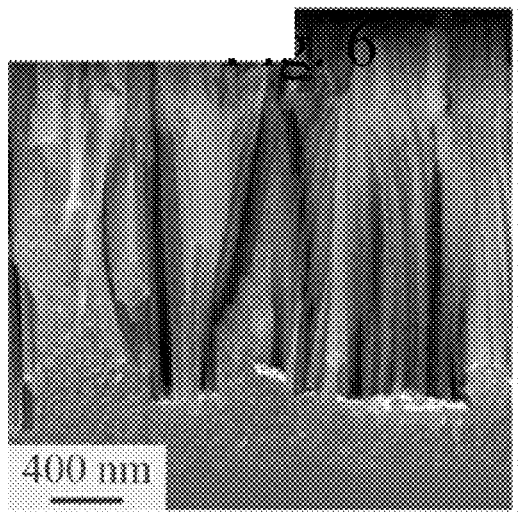
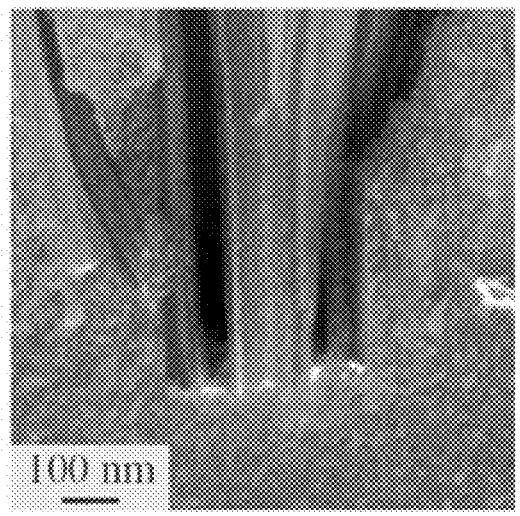
FIG. 26A  FIG. 26B
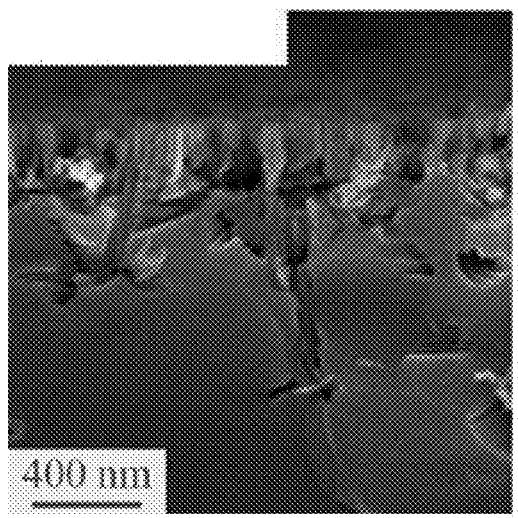
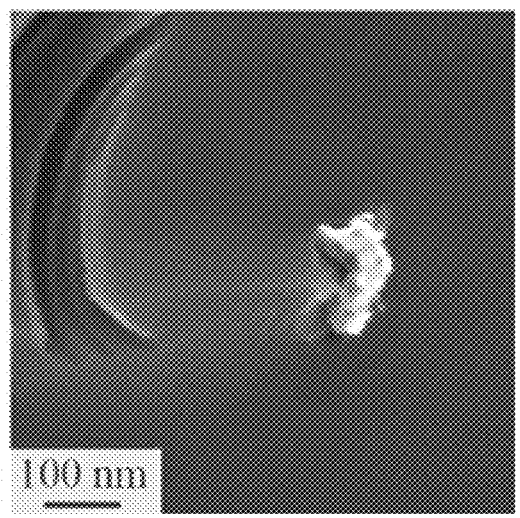
FIG. 27A  FIG. 27B

ARTICLE AND PROCESS FOR SELECTIVE DEPOSITION

CROSS REFERENCE TO RELATED APPLICATIONS

The present application claims the benefit of U.S. Provisional Patent Application Ser. No. 61/928,090 filed Jan. 16, 2014, the disclosure of which is incorporated herein by reference in its entirety.

STATEMENT REGARDING FEDERALLY SPONSORED RESEARCH

This invention was made with United States government support from the National Institute of Standards and Technology. The government has certain rights in the invention.

BACKGROUND

A density gradient in silicon can be made by deep reactive ion etching or dicing a silicon wafer with a dicing saw. These methods may provide a relatively course gradient and may not be suited for creating a density gradient in a curved surface.

The art is receptive to articles and processes that provide density gradients in a material.

BRIEF DESCRIPTION

The above and other deficiencies are overcome by, in an embodiment, a process for depositing a metal, the process comprising: disposing an activating catalyst on a substrate; contacting the activating catalyst with a metal cation from a vapor deposition composition; contacting the substrate with a reducing anion from the vapor deposition composition; performing an oxidation-reduction reaction between the metal cation and the reducing anion in a presence of the activating catalyst; and forming a metal from the metal cation to deposit the metal on the substrate.

Further disclosed is a system for depositing a metal, the system comprising: an activating catalyst to deposit on a substrate; and a primary reagent to form: a metal cation to deposit on the substrate as a metal; and a reducing anion to provide electrons to the activating catalyst, the metal cation, the substrate, or a combination comprising at least one of the foregoing, wherein the primary reagent forms the metal cation and the reducing anion in response to being subjected to a dissociating condition.

BRIEF DESCRIPTION OF THE DRAWINGS

The following descriptions should not be considered limiting in any way. With reference to the accompanying drawings, like elements are numbered alike:

FIGS. 26A and 26B show a micrograph of an etch void in a substrate according to Example 3;
FIGS. 27A and 27B show a micrograph of an etch void in a substrate according to Example 3.

DETAILED DESCRIPTION

Figure 1:
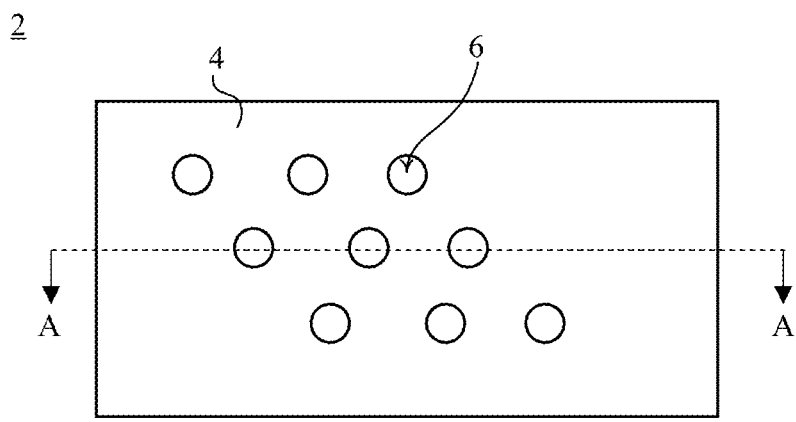
FIG. 1 shows a top view of an article.

A detailed description of one or more embodiments is presented herein by way of exemplification and not limitation.

It has been discovered that a coating includes a gradient in a density of a volume can be an antireflective coatings over a wide range of incident wavelengths. Advantageously, the coating is applicable to applications such as an electromagnetic detector or electromagnetic absorber. The coating minimizes an amount of photons reflecting from the coating. The gradient can vary uniformly over a thickness of the coating. Additionally, a one-dimensional, two-dimensional, or three-dimensional nano-sized or micron sized etch void can be formed in a substrate from an activating catalyst in combination with a liquid medium or a vapor composition. An etch rate, feature resolution, or etch path of the activating catalyst is controllable to form the one-dimensional, two-dimensional, or three-dimensional etch void. Such an etch void can have a selectable aspect ratio or nanometer resolution. Further, the deposit can be formed on a substrate through deposition from the activating catalyst and vapor deposition composition.

According to an embodiment, an article includes a substrate and a coating disposed on the substrate. The coating includes a microporous layer, a gradient in a density of a volume of the microporous layer, and a plurality of dendritic veins that are anisotropically disposed in the coating. In an embodiment, the coating is an antireflective coating. According to an embodiment, the substrate and coating independently include a semiconductor material. The semiconductor material includes an element from group III, group IV, group V of the periodic table, or a combination comprising at least one of the foregoing elements. The substrate and the coating can be an identical semiconductor material.

In an embodiment, a process for forming a coating includes disposing an activating catalyst on a substrate, introducing an activatable etchant, introducing an etchant oxidizer. The process also includes performing an oxidation-reduction reaction between the substrate, the activatable etchant, and the etchant oxidizer in a presence of the activating catalyst. The oxidation-reduction reaction can occur in a liquid medium. The liquid medium includes the activatable etchant and the etchant oxidizer. In an embodiment, the process further includes forming an etchant product that includes atoms from the substrate, removing a portion of the etchant product from the substrate, and forming a dendritic vein in the substrate to form the coating. According to an embodiment, the dendritic veins is anisotropically disposed in the coating. In a particular embodiment, the process further includes forming a gradient in a density of a volume of the coating.

According to an embodiment, a process for forming a coating includes disposing an activating catalyst on a substrate, introducing an activatable etchant, subjecting the activating catalyst and the activatable etchant to an electric potential, and performing an electrochemical reaction between the substrate and the activatable etchant in a presence of the catalyst and the electric potential. The electrochemical reaction occurs in a liquid medium that includes the activatable etchant and the etchant oxidizer. The process also includes forming an etchant product comprising atoms from the substrate, removing a portion of the etchant product from the substrate, and forming a plurality of dendritic veins in the substrate to form the coating. The plurality of dendritic veins is anisotropically disposed in the coating. During the process, a temperature of the substrate during the electrochemical reaction can be less than 150° C.

In an embodiment, a process for etching includes disposing an activating catalyst on a substrate, providing a vapor composition comprising an etchant oxidizer, an activatable etchant, or a combination thereof, contacting the activating catalyst with the etchant oxidizer, contacting the substrate with the activatable etchant, performing an oxidation-reduction reaction between the substrate, the activatable etchant, and the etchant oxidizer in a presence of the activating catalyst and the vapor composition, forming an etchant product comprising atoms from the substrate, and removing the etchant product from the substrate to etch the substrate. The process further includes adjusting a position of the activating catalyst in the substrate or forming an etch void in the substrate as a result of removing the etchant product from the substrate. A shape of the etch void corresponds to a cumulative position of the activating catalyst in the substrate or formation of an additional etch void produced proximate to a peripheral location of the cumulative position of the activating catalyst. Without wishing to be bound by theory, it is believed that in this manner secondary etching occurs when a hole ($h^+$) injection rate at an activating catalyst-substrate interface is larger than an etch rate of the substrate beneath the activating catalyst. Such a condition can provide additional etching in a region surrounding the activating catalyst to form a region of microporous silicon proximate to an etch path. The process further can include controlling a rate of forming the etch product.

According to an embodiment, a process for depositing a metal includes disposing an activating catalyst on a substrate, contacting the catalyst with a metal cation from a vapor deposition composition, contacting the substrate with a reducing anion from the vapor deposition composition, performing an oxidation-reduction reaction between the metal cation and the reducing anion in a presence of the activating catalyst, and forming a metal from the metal cation to deposit the metal on the substrate. The process further includes forming the vapor deposition composition by combining the metal cation from a first source and the reducing anion from a second source and providing the vapor deposition composition to the substrate and the activating catalyst for contacting the activating catalyst with the metal cation and contacting the substrate with the reducing anion. The process also includes forming the vapor deposition composition that includes the metal cation and the reducing anion and providing the vapor deposition composition to the substrate and the activating catalyst for contacting the activating catalyst with the metal cation and contacting the substrate with the reducing anion. The process further includes dissociating a primary reagent to form the metal cation and the reducing anion, forming the metal cation and the reducing anion in a liquid state in response to dissociating the primary reagent, and volatilizing the metal cation, the reducing anion, or a combination comprising at least one of foregoing to form the vapor deposition composition.

In an embodiment, a system for depositing a metal includes an activating catalyst to deposit on a substrate and a primary reagent to form a metal cation to deposit on the substrate as a metal and a reducing anion to provide electrons to the activating catalyst, the metal cation, the substrate, or a combination thereof. The primary reagent forms the metal cation and the reducing anion in response to being subjected to a dissociating condition.

Figure 2:
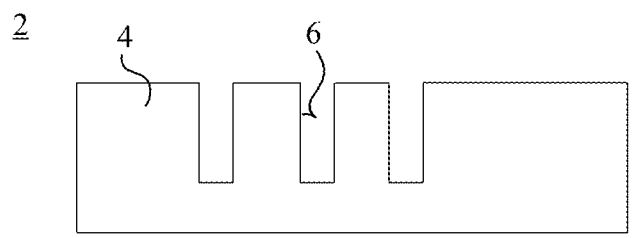
FIG. 2 shows a cross-section of the article shown in FIG. 1.
Figure 3:
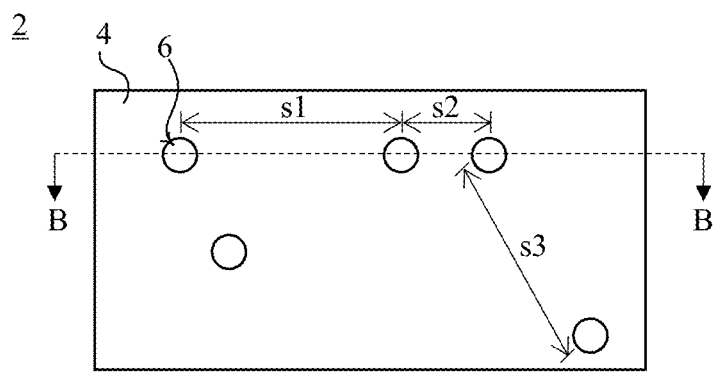
FIG. 3 shows a top view of an article.

In an embodiment, as shown in FIG. 1 (top view of article 2), article 2 includes etch void 6 disposed in substrate 4. Etch void 6 extends from a surface of article 2 to a depth below the surface of article 2. FIG. 2 shows a cross-section along line A-A of article 2. A transverse cross sectional shape of etch void 6 can be circular, ellipsoidal, polygonal, irregular, and the like. A plurality of etch voids 6 can be disposed in substrate 4 and arranged to have a same spacing between adjacent etch voids 6. In some embodiments, etch voids 6 are arranged to have a different spacing between adjacent etch voids 6 as shown for top view of article 2 in FIG. 3. Here, adjacent etch voids 6 can be separated by first spacing S1, second spacing S2, third spacing S3, and the like, wherein the spacings (S1, S2, S3) are different from one another.

Figure 4:
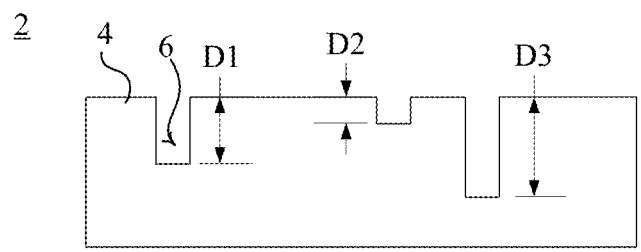
FIG. 4 shows a cross-section of the article shown in FIG. 3.

Depths of etch voids 6 in article 2 can be the same or different. According to an embodiment, depths of etch voids 6 are the same. In a certain embodiment, the depth of some or all of etch voids 6 is different from one another. With reference to FIG. 4, which is a cross-sectional view along line B-B of article 2 shown in FIG. 3, etch voids 6 can have different depths such as first depth D1, second depth D2, or third depth D3.

Figure 5:
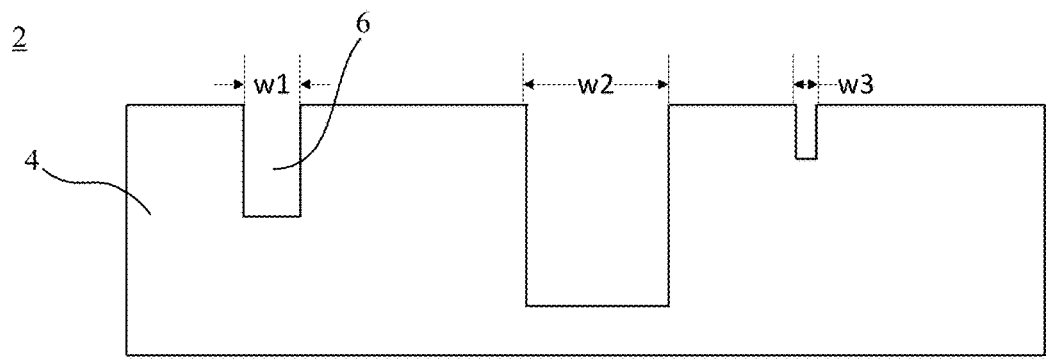
FIG. 5 shows a cross-section of an article.

Widths of etch voids 6 in article 2 can be the same or different. According to an embodiment, widths of etch voids 6 are the same. In a certain embodiment, the width of some or all of etch voids 6 is different from one another. In an embodiment is shown in FIG. 5, which is a cross-section of article 2, etch voids 6 can have different widths such as first width W1, second width W2, or third width W3.

Figure 6:
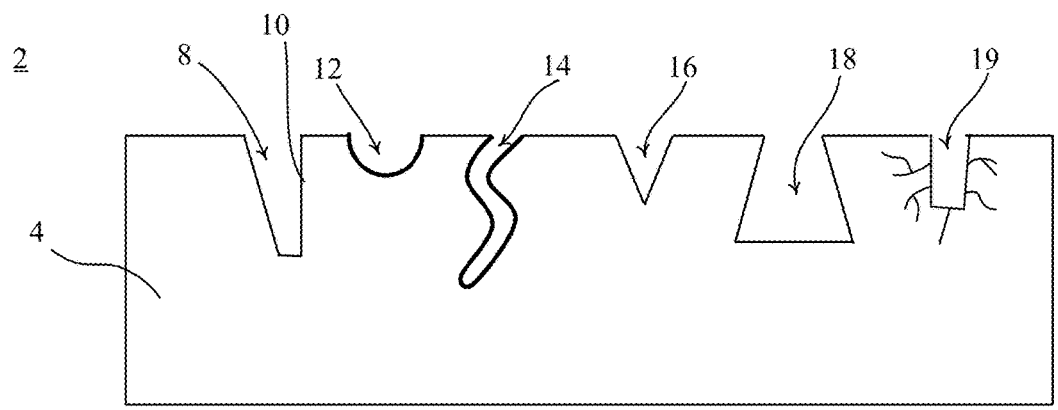
FIG. 6 shows a cross-section of an article.

In addition to a transverse cross-sectional shape, etch void 6 can have a longitudinal cross-sectional shape that is the same or different than the transverse cross-sectional shape of etch void 6. With reference to FIG. 6, etch voids 6 are bounded by wall 10 and exposed to an exterior of article 2. Wall 10 can be curved, straight, or combination thereof. Etch void 6 can have wall 10 that is smooth or angular. An opening of etch void six can be larger in a particular dimension than any other portion of etch void 6 or smaller in a particular dimension than the other portion of etch void 6. Exemplary transverse cross-sectional shapes of etch void 6 include asymmetrical 8, spherical 12, serpentine 14, apical 16, frustoconical 18, branching 19, and the like.

Figure 7:
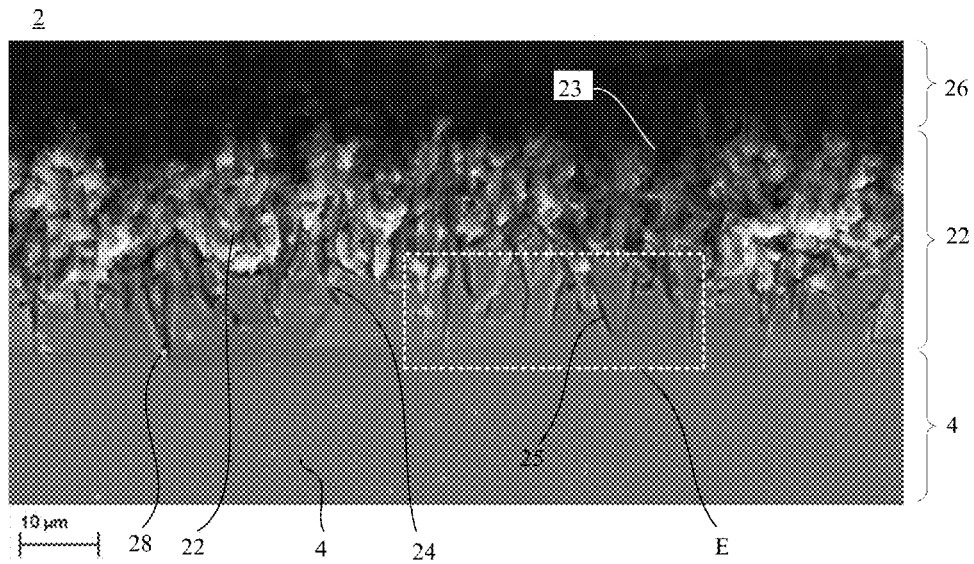
FIG. 7 shows a micrograph of a cross-section of an article.

In an embodiment, a plurality of etch voids 6 are disposed in article 2 to form coating 22 as shown in FIG. 7, which shows a micrograph of article 2. Coating 22 is disposed on substrate 4. Here, etch voids 6 are anisotropically arranged as dendritic veins 24 such that a top surface of coating 22 has first interface 23 with an external environment such as air 26. Additionally, dendritic veins 24 have a greatest number density at first interface 23. Second interface 25 between coating 22 and substrate 4 occurs where wall 10 of etch voids 6 and substrate 4 meet. As such, second interface 25, as shown in FIG. 7, is irregular, i.e., nonplanar on a selected scale such as a nanometer or micrometer scale. Coating 22 also includes a microporous layer that is a same material as substrate 4. In an embodiment, dendritic veins 24 are produced in substrate 4 by forming the microporous layer, which has a plurality of pores in which some of the pores interconnect to from dendritic vein 24.

In an embodiment, the number density of dendritic veins 24 decreases from first interface 23 to second interface 25. As a result, coating 22 has a gradient in a density of the microporous layer. The density of the microporous layer and coating 22 is greatest at second interface 25, and the density of microporous layer and coating 22 is released at first interface 23. The gradient in the density of the volume of the microporous layer varies uniformly from first interface 23 to second interface 25. Accordingly, a refractive index of coating 22 varies with the gradient in the density of the volume of the microporous layer such that coating 22 also has a gradient in its refractive index from first interface 23 two second interface 25. Moreover, a refractive index of coating 22 at first interface 23 can be selected to match a refractive index of the external environment such as air 26. Further, a refractive index of coating 22 at second interface 25 can be selected to match a refractive index of substrate 4. As a result, article 2 includes coating 22 that has a refractive index that uniformly changes from a first refractive index at first interface 23 to a second refractive index at second interface 25. The first refractive index or the second refractive index can be tuned respectively to match the refractive index of the external environment (e.g., air 26) and substrate 4 by tailoring the formation of dendritic veins 24. According to an embodiment, the gradient in the refractive index and the density of the volume of the microporous layer is selectively tunable by virtue of formation of dendritic veins 24.

Figure 8:
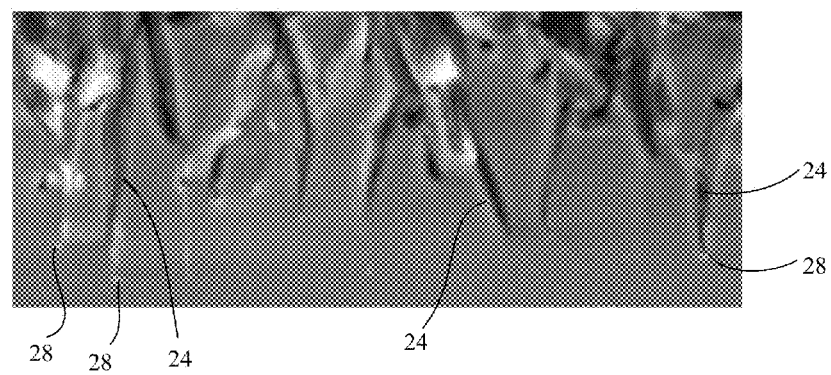
FIG. 8 shows an enlarged view of a portion of the article shown in FIG. 7.

FIG. 8 shows an enlarged view of portion E of article 2 shown in FIG. 7. Here, activating catalyst 28 is shown as a white feature of terminals of dendritic vein 24. Activating catalyst 28 provides selective control for production of dendritic veins 24 and to select the gradient in the density of the volume of the microporous layer of coating 22. As will be explained, activating catalyst 28 is involved in etching substrate four to form dendritic veins 24 and may be left disposed in dendritic veins 24 or can be removed from dendritic veins 24 in article 2.

Figure 9:
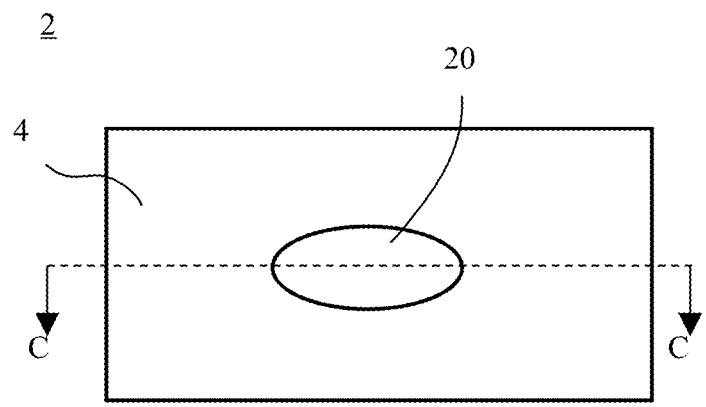
FIG. 9 shows a top view of an article.
Figure 10:
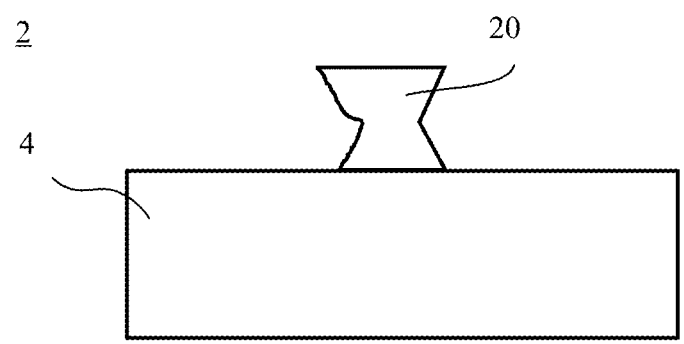
FIG. 10 shows a cross-section of the article shown in FIG. 9.

Besides forming etch void 6 and dendritic veins 24, activating catalyst 28 can be used to form deposit 20 on substrate 4 as shown in a top view of article 2 in FIG. 9. That is, deposit 20 is a structure disposed on substrate 4 and is a product of growth on substrate 4 from activating catalyst 28 that serves as a seed site for such growth. A cross-section along line C-C of article 2 is shown in FIG. 10. Here, deposit 20 has an asymmetrical shape although deposit 20 is not limited thereto. In an embodiment, deposit 20 can have a selected shape based on growth of deposit 20 on activating catalyst 28.

Figure 11:
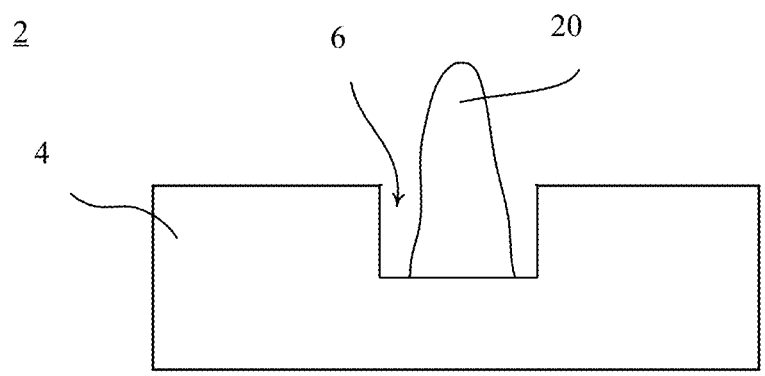
FIG. 11 shows a cross-section of an article.

In some embodiments, deposit 20 is disposed in etch void 6 within substrate 4 at shown in FIG. 11, which is a cross-section of article 2. It is contemplated that deposit 20, etch void 6, substrate 4, or article 2 can have an arbitrary shape that can be selected based on controlled process conditions.

In an embodiment, substrate 4 includes a semiconductor. An exemplary semiconductor is an element from group 11, 12, 13, 14, 15, or 16 (IUPAC nomenclature, which respectively is identical to group I, II, III, IV, V, or VI) of the periodic table such as a Si, Ga, Ge, As, In, Sn, Sb, Te, At, Hf, Zn, and the like, or a combination thereof. According to an embodiment, substrate 4 is a compound semiconductor such as SiC, SiGe, GaN; a group 13-15 (also referred to as a group III-V) semiconductor such as AlSb, AlAs, Aln, AlP, BN, GaSb, GaAs, GaN, GaP, InSb, InAs, InN, InP, and the like; a group 12-16 (group II-VI) semiconductor such as CdSe, CdS, CdTe, ZnO, ZnSe, ZnS, ZnTe, and the like; a group 11-17 (group I-VII) semiconductor such as CuCl and the like; a group 14-16 (group IV-VI) semiconductor such as PbS, PbTe SnS, and the like; a layer semiconductor such as $Pb_2$, $MoS_2$, GaSe, and the like; an oxide semiconductor such as CuO, $Cu_2O$, and the like; (Al,Ga)N, (Al,Ga)As, (In,Ga) As, (Al,Ga)Sb, (In,Ga)Sb, as well as nitride, arsenide, antimonide quaternary III-V alloys, or a combination comprising at least one of the foregoing. Examples of II-VI alloys include, but are not limited to CdSe, CdTe, CdS, ZnSe, and combinations thereof. Examples of Group III-V ternary alloys include, but are not limited to, (Ga,Al)As, (In,Ga)As, and combinations thereof. Exemplary Group III-V quaternary alloys include (Ga,InXAs,P), (In,Al,Ga)Sb, and the like. Exemplary Group III-nitride alloys include (Ga,Al)N, (Ga,In)N, (Al,In)N, (Ga,Al,In)N, and combinations thereof. Quaternary alloys of the above may also be employed.

Substrate 4 also can include a supplemental element such as C, H, N, Li, Na, K, Mg, Ca, Sr, Ba, Bi, B, Al, P, S, O, and the like in an amount typically less than an amount of the semiconductor. In an embodiment, substrate 4 includes silicon, and the silicon is optionally doped. According to an embodiment, the semiconductor is an intrinsic semiconductor or an extrinsic semiconductor doped with a selected dopant, e.g., a p-dopant or an n-dopant. In one embodiment, substrate 4 includes a p-dopant. In another embodiment, substrate 4 includes an n-dopant. In a particular embodiment, substrate 4 is p-doped Si. In one embodiment, substrate 4 is n-doped Si. Substrate 4 can be produced from, e.g., commercially available semiconductor grade p-doped Si having a particular crystalline orientation, e.g., having Miller indices <111>, <100>, and the like. Substrate 4 can be amorphous, polycrystalline, or a single crystal. In an embodiment, substrate 4 has a stacked structure that includes a plurality of semiconductor layers such as by forming films as SiGe/Si/SiGe/Si on the Si substrate. In some embodiments, substrate 4 includes crystalline domains among amorphous material. In an embodiment, substrate 4 is selected to provide coating 22 by etching of substrate 4 in a presence of activating catalyst 28. According to an embodiment, coating 22 includes a same material as substrate 4. In an embodiment substrate 4 and coating 22 independently include a semiconductor material. 4. In an embodiment, the semiconductor material includes an element from group III, group IV, group V of the periodic table, or a combination thereof. In a certain embodiment, substrate 4 and coating 22 are an identical semiconductor material. In some embodiments, coating 22 is a different material than substrate 4 such that article 2 is a laminate having coating 22 of a first material disposed on substrate 4 of a second material.

In a particular embodiment, substrate 4 is selected to support activating catalyst 28 for formation of deposit 20.

According to an embodiment, activating catalyst 28 is a metal. Exemplary metals include elements from transition metal (e.g., group IB, IIB, IIIB, IVB, V, VIB, VII B, VIII), alkali metal (e.g., Na), alkaline earth metal (e.g., Mg) of the periodic table, including but not limited to, include Zr, Hf, Ti, V, Cr, Mn, Fe, Co, Ni, Cu, Zn, Nb, Mo, Tc, Ru, Rh, Pd, Ag, Cd, Ta, W, Re, Os, Ir, Pt, Au, Li, Na, K, Be, Mg, Ca, Sr, Ba, Gd, a compound thereof, an alloy thereof, or a combination thereof. In a particular embodiment, the metal is platinum, gold, silver, or a combination thereof. Further, the metal can be in any suitable form such as powder, dust, particle, and the like. In an embodiment, the metal is a nanoparticle. In a further embodiment, the metal is charge neutral in activating catalyst 28. As used herein, "activating catalyst" refers to a catalyst that has an activity effective to catalyze etching of substrate 4 in presence of the activatable etchant and etchant oxidizer or effective to catalyze formation of deposit 20 on substrate 4 in a presence of a vapor deposition composition.

According to an embodiment, activating catalyst 28 is a low-temperature catalyst, which has an activity effective to catalyze etching or metal formation over a broad temperature range or broad pressure range. In an embodiment, activating catalyst 28 is a low-temperature catalyst having catalytic activity at a temperature, e.g., from 0° C. to 500° C., specifically 20° C. to 300° C., and more specifically 20° C. to 150° C. Moreover, activating catalyst 28 effectively catalyzes etching of substrate 4 or deposition of deposit 20 at a low pressure, low number density, or low concentration of etchant oxidizer, activatable etchant, or vapor deposition composition.

Etch void 6 (e.g., dendritic vein 24) is formed from activating catalyst 28 and substrate 4 in presence of an activatable etchant an etchant oxidizer. In an embodiment, the activatable etchant is a fluoride etchant. Exemplary fluoride etchants include hydrofluoric acid (HF), buffered oxide etch (BOE), boron hydrogen fluoride (BHF), or other fluoride complex (e.g., $BF_4$—*, $PF_6$—*, $CF_3SO_3$—*, $AsF_6$—*, and SbFe—*, where * represents a chemical compound, species, or support), and the like.

In a certain embodiment, activating catalyst 28 is a halide source, reactive halide species, β-diketone activatable etchant, and the like.

The halide source is a material that provides a halide atom to interact with substrate 4 to form etchant product 32 (see FIGS. 12A, 12B, and 12C) under reaction conditions in presence of activating catalyst 28. Examplary halide sources include a metal halide, e.g., $TiCl_4$, $NbCl_5$, $NbBr_5$, $TaCl_5$, $TaBr_5$, $MoF_6$, $WF_6$, $BCl_3$, $SnCl_4$, $SnBr_4$; organic halogen compound, e.g., $CF_2Cl_2$, $CBr_4$, CFCF, and the like; elemental halogen, e.g., $F_2$, $Cl_2$, $Br_2$, or $I_2$; interhalogens, e.g., FCl, CBr, ClI; hydrogen halide, e.g., HF, HCl, HBr, or HI; cyanogen halide, or other suitable halide source including a non-metal halide, e.g., $XeF_2$ $PCl_5$, and the like. In some embodiments, the halide source includes a plurality of types of halide atoms, e.g., chlorine and fluorine. In some embodiments, the halide source is $BCl_3$, $CF_2Cl_2$, $NbCl_5$, $TaCl_5$, or $WCl_6$. An analog or combination of any of the foregoing can be used as the halide source.

Reactive halide species etch substrate 4 to produce to form etchant product 32. Exemplary reactive halide species include a metal halide, metal oxyhalide, metal hydroxyhalide, and the like.

Exemplary β-diketone activatable etchants include β-diketones such as acetylacetone (2,4-pentanedione), hexafluoroacetylacetone (1,1,1,5,5,5-hexafluoro-2,4-pentanedione), tetramethylheptanedione (2,2,6,6-tetramethyl-3,5-heptanedione), 1,1,1,2,2-pentafluoro-6,6-dimethyl-3,5-heptanedione, trifluoroacetylacetone (1,1,1-trifluoro-2,4-pentanedione), combinations, analogs, and the like.

Exemplary etchant oxidizers include hydrogen peroxide ($H_2O_2$), $K_2MnO_4$ $FeNO_3$, $O_3$, $CO_2$, $K_2Cr_2O_7$, $CrO_3$, $KIO_3$, $KBrO_3$, $NaNO_3$, $HNO_3$, $KMnO_4$, ethyl ketone peroxide, benzoyl peroxide, acetone peroxide, t-amyl peroxybenzoate, t-hexyl peroxybenzoate, 1,3,3,3-tetramethylbutyl peroxybenzoate, t-amyl peroxy-m-methylbenzoate, t-hexyl peroxy-m-methylbenzoate, 1,1,3,3-tetramethylbutyl peroxy-m-methylbenzoate, t-hexyl peroxy-p-methylbenzoate, t-hexyl peroxy-o-methylbenzoate, t-hexyl peroxy-p-chlorobenzoate, bis(t-hexyl peroxy)phthalate, bis(t-amyl peroxy)isophthalate, bis(t-hexyl peroxy)isophthalate, bis(t-hexyl peroxy)terephthalate, tris(t-hexyl peroxy)trimellitate, 1,1-bis(t-butylperoxy)-3,3,5-trimethylcyclohexane, 1,1-bis(t-hexylperoxy)-3,3,5-trimethylcyclohexane, 1,1-bis(t-hexylperoxy)cyclohexane, 1,1-bis(t-butylperoxy)cyclododecane, 1,1-bis(t-butylperoxy)cyclohexane, 2,2-bis(t-butylperoxy)octane, n-butyl-4,4-bis(t-butylperoxy)butane, n-butyl-4,4-bis(t-butylperoxy)valerate, di-t-butyl peroxide, dicumyl peroxide, t-butyl cumyl peroxide, α,α'-bis(t-butylperoxy-m-isopropyl)benzene, α,α'-bis(t-butylperoxy)diisopropylbenzene, 2,5-dimethyl-2,5-di(t-butylperoxy)hexane, acetyl peroxide; isobutyryl peroxide, octanoyl peroxide, decanoyl peroxide, lauroyl peroxide, 3,5,5-trimethyl hexanoyl peroxide, benzoyl peroxide, 2,4-dichlorobenzoyl peroxide, m-toluoyl peroxide, t-butyl peroxyacetate, t-butyl peroxyisophtalate, t-butyl peroxy-2-ethylhexanoate, t-butyl peroxylaurate, t-butyl peroxybenzoate, di-t-butyl peroxyisophtalate, 2,5-dimethyl-2,5-di(benzoylperoxy)hexane, t-butyl peroxymaleic acid, t-butyl peroxyisopropylcarbonate, cumyl peroxyoctate, t-butyl hydroperoxides, cumene hydroperoxides, diisopropylbenzene hydroperoxides, 2,5-dimethylhexane-2,5-dihydroperoxide, and 1,1,3,3-tetramethylbutyl hydroperoxide, and the like.

The liquid composition can include a solvent such as water, an ionic liquid, organic solvent, aqueous solvent, acidic solvent, basic solvent, and the like. The solvent can be selected to effectively solvate or disperse the activating catalyst, etchant oxidizer, activatable etchant, and the like.

According to an embodiment, deposit 20 (e.g., a metal) is formed on substrate 4 in an electroless deposition manner in presence of activating catalyst 28 and a vapor deposition composition, which includes, e.g., a metal cation. Here, the metal cation can be provided from a primary reagent that includes a metal, corresponding to the metal cation. Exemplary primary reagents include a metal alkyl, metal alkyl amide, metal alkoxide, metal beta-diketonate, organometallic, metal carbonyl, metal salt, and the like.

Exemplary metal alkyls include diethyldiselenide, diethylzinc, dimethylaluminum i-propoxide, dimethylcadmium, dimethylmercury, dimethylselenide, dimethylzinc, tetraethylgermane, tetramethylgermane, tetramethyltin, tetra-n-butylgermane, triethyl(tri-sec-butoxy)dialuminum, triethylaluminum, triethylarsine, triethylboron, triethylgallium, tri-i-butylaluminum, trimethylaluminum, trimethylantimony, trimethylarsine, trimethylboron, trimethylgallium, trimethylindium, and the like.

Exemplary metal alkyl amides include bis(p-dimethylamino)tetrakis(dimethylamino)digallium, pentakis(dimethylamino)tantalum(V), tetrakis(diethylamino)titanium, tetrakis(diethylamino)zirconium, tetrakis(dimethylamino) titanium, tetrakis(dimethylamino)zirconium, tris[n,n-bis (trimethylsilyl)amide]yttrium(III), tris(dimethylamino) antimony, tris(dimethylamino)arsine, tris(dimethylamino) phosphine, tris(dimethylamino)silane, and the like.

Exemplary metal alkoxides include aluminum s-butoxide, aluminum ethoxide, aluminum i-propoxide, dimethylaluminum i-propoxide, antimony(III) n-butoxide, antimony (III) ethoxide, germanium (IV) ethoxide, hafnium (IV) t-butoxide, hafnium (IV) ethoxide, niobium (V) ethoxide, tantalum (V) ethoxide, tantalum(V) methoxide, tetrabutoxysilane, tetraethoxysilane, tetramethoxysilane, thallium(I) ethoxide, tin (IV) t-butoxide, titanium(IV) n-butoxide, titanium(IV) t-butoxide, titanium(IV) ethoxide, titanium(IV) i-propoxide, vanadium(V) tri-i-propoxy, zirconium(IV) t-butoxide, zirconium(IV)t-butoxide, zirconium(IV) ethoxide, and the like.

Exemplary metal beta-diketonates include aluminum acetylacetonate, aluminum hexafluoroacetylacetonate, bis (6,6,7,7,8,8,8-heptafluoro-2,2-dimethyl-3,5-octanedionate) barium, bis(6,6,7,7,8,8,8-heptafluoro-2,2-dimethyl-3,5-octanedionate)calcium, bis(2,2,6,6-tetramethyl-3,5-heptanedionato)barium hydrate
  bis(2,2,6,6-tetramethyl-3,5-heptanedionato)barium, bis (2,2,6,6-tetramethyl-3,5-heptanedionato)barium, bis(2,2,6, 6-tetramethyl-3,5-heptanedionato)calcium, bis(2,2,6,6-tetramethyl-3,5-heptanedionato)copper(II), bis(2,2,6,6-tetramethyl-3,5-heptanedionato)(1,5-cyclooctadiene) ruthenium(II), bis(2,2,6,6-tetramethyl-3,5-heptanedionato) lead(II), bis(2,2,6,6-tetramethyl-3,5-heptanedionato) magnesium, bis(2,2,6,6-tetramethyl-3,5-heptanedionato) nicke(II), bis(2,2,6,6-tetramethyl-3,5-heptanedionato) strontium, bis(2,2,6,6-tetramethyl-3,5-heptanedionato) strontium, bis(2,2,6,6-tetramethyl-3,5-heptanedionato)zinc, calcium hexafluoroacetylacetonate, cerium(III) trifluoroacetylacetonate, chromium(III) acetylacetonate, chromium (III) hexafluoroacetylacetonate, copper(II) hexafluoroacetylacetonate, copper(II) hexafluoroacetylacetonate, copper(II) trifluoroacetylacetonate, 1,5-cyclooctadiene(acetylacetonato)iridium(I), dimethyl(acetylacetonate)gold(111), dimethyl(trifluoroacetylacetonate)gold(III), erbium(III) hexafluoroacetylacetonate, gallium(III) acetylacetonate, indium(III) trifluoroacetylacetonate, iron(III) trifluoroacetylacetonate, lead(II) hexafluoroacetylacetonate, neodymium (III) hexafluoroacetylacetonate, neodymium(III) trifluoroacetylacetonate, platinum(II) hexafluoroacetylacetonate, praseodymium(III) hexafluoroacetylacetonate, praseodymium(III) trifluoroacetylacetonate, rhodium(III) acetylacetonate, samarium(III) trifluoroacetylacetonate, strontium hexafluoroacetylacetonate, tantalum(V) tetraethoxyacetylacetonate, tantalum(V) (tetraethoxy), tetrakis(2,2,6,6-tetramethyl-3,5-heptanedionato)niobium(IV), tetrakis(2,2,6, 6-tetramethyl-3,5-heptanedionato)zirconium(IV), 2,2,6,6-tetramethyl-3,5-heptanedionato silver(I), 2,2,6,6-tetramethyl-3,5-heptanedionato thallium(I), thallium(I) hexafluoroacetylacetonate, tin (II) acetylacetonate, tin (II) hexafluoroacetylacetonate, tris (norbornadieneXacetylacetonato)iridium(III), tris 2,2,6,6)'-tetramethyl-3,5-heptanedionatochromium(III), tris 2,2,6,6-tetramethyl-3,5-heptanedionatocobalt(III), tris(2,2,6,6,-tetramethyl-3,5-heptanedionato)erbium(III), tris 2,2,6,6§tetramethyl-3,5-heptanedionato indium(III), tris 2,2,6,6-tetramethyl-3,5-heptanedionato iron(III), tris 2,2,6,6-tetramethyl-3,5-heptanedionato lanthanum(III), and the like.

In certain embodiments, the primary reagent is the organometallic compound that includes a metallocene, metal carbonyl, or a combination thereof. According to an embodiment, the organometallic compound can decompose to form numerous reactant products, e.g. a metal cation, reducing anion, or a combination thereof. Such decomposition products can enter into the gas phase as part of the vapor deposition composition for interaction with activating catalyst 28 or substrate 4.

As used herein "organometallic compound" refers to a compound that contains a bond between a metal and a carbon atom in a neutral molecule, ion, or radical. In an embodiment, the organometallic compound contains a metal (e.g., a transition metal) with metal-carbon single bonds or metal-carbon multiple bonds as well as metal complexes with unsaturated molecules (metal-π-complexes). Examples of the organometallic compounds are sandwich compounds. Such sandwich compounds include full sandwiches, half sandwiches, multidecker sandwiches such as triple decker sandwiches, and inverse sandwiches. The organometallic compound can include more than one metal atom, and each metal atom can be a different a metal element, the same metal element, or a combination thereof. In an embodiment, multiple metal atoms can be bonded to one another in addition to carbon or bound only to the organic ligand portions of the sandwich compound.

In an embodiment, the ligands of the organometallic compound are the same or different. Examples of the ligand include alkyl, aryl, hydride, halide, amide, $\eta^2$-alkene, CO, CS, amine, nitrile, isocyanide, phosphane, alkylidene ($CR_2$), alkyldiide ($CR_2^{2-}$), nitrene (NR), imide ($NR^{2-}$), oxide ($O^{2-}$), alkylidyne (CR), alkyltriide ($CR^{3-}$), $\eta^3$-allyl, $\eta^3$-enyl, $\eta^3$-cyclopropenyl, NO, $\eta^4$-diene, $\eta^4$-cyclobutadiene, $\eta^5$-cyclopentadienyl, $\eta^6$-arene, $\eta^6$-triene, $\eta^7$-tropylium, $\eta^7$-cycloheptatrienyl, $\eta^8$-cyclooctatetraene, or a combination comprising at least one of the foregoing. Here, R represents a functional group selected from hydrogen, alkyl, alkoxy, fluoroalkyl, cycloalkyl, heterocycloalkyl, cycloalkyloxy, aryl, aralkyl, aryloxy, aralkyloxy, heteroaryl, heteroaralkyl, alkenyl, alkynyl, $NH_2$, amine, alkyleneamine, aryleneamine, alkenyleneamine, and hydroxyl. In addition, the organometallic compound can include various inorganic ligands, for example, $CO_2$, and CN, in their neutral or ionic forms.

According to an embodiment, the organometallic compound is a metal carbonyl. Exemplary metal carbonyls include $V(CO)_6$, $Cr(CO)_6$, $Mn_2(CO)_{10}$, $Fe(CO)_5$, $Fe_2(CO)_9$, $Fe_3(CO)_{12}$, $Co_2(CO)_8$, $Co_4(CO)_{12}$, $Ni(CO)_4$, $Mo(CO)_6$, $Tc_2(CO)_{10}$, $Ru(CO)_5$, $Ru_3(CO)_{12}$, $Rh_4(CO)_{12}$, $Rh_6(CO)_{16}$, $W(CO)_6$, $Re_2(CO)_{10}$, $Os(CO)_5$, $Os_3(CO)_{12}$, $Ir_4(CO)_{12}$, and the like. In a non-limiting embodiment, the metal carbonyl is in a liquid state such as $Fe(CO)_5$.

In an embodiment, the ligand of the organometallic compound is an unsaturated group or molecule, including, for example, $\eta^3$-allyl, $\eta^3$-(Z)-butenyl, $\eta^3$-2-methylpropenyl, $\eta^4$-2-methylidene-propane-1,3-diyl, $\eta^6$-2,3-dimethylidenebutane-1,4-diyl, $\eta^5$-(Z,Z)-pentadienyl, $\eta^5$-cyclopentadienyl (hereinafter "cyclopentadienyl" or "cp"), pentamethyl-$\eta^5$-cyclopentadienyl, $\eta^5$-cyclohexadienyl, $\eta^7$-cycloheptatrienyl, $\eta^7$-cyclooctatrienyl, 1-methyl-$\eta^5$-borole, $\eta^5$-pyrrolyl, $\eta^5$-phospholyl, $\eta^5$-arsolyl, $\eta^6$-boratabenzene, and $\eta^6$-1,4-diboratabenzene.

The ligands of the organometallic compound can be substituted a (e.g., 1, 2, 3, 4, 5, 6 or more) substituents independently selected from a halide (e.g., F$^-$, Cl$^-$, Br$^-$, I$^-$), hydroxyl, alkoxy, nitro, cyano, amino, azido, amidino, hydrazino, hydrazono, carbonyl, carbamyl, thiol, $C_1$ to $C_6$ alkoxycarbonyl, ester, carboxyl or a salt thereof, sulfonic acid or a salt thereof, phosphoric acid or a salt thereof, $C_1$ to $C_{20}$ alkyl, $C_2$ to $C_{16}$ alkynyl, $C_6$ to $C_{20}$ aryl, $C_7$ to $C_{13}$ arylalkyl, $C_1$ to $C_4$ oxyalkyl, $C_1$ to $C_{20}$ heteroalkyl, $C_3$ to $C_{20}$ heteroaryl (i.e., a group that comprises at least one aromatic ring, wherein at least one ring member is other than carbon), $C_3$ to $C_{20}$ heteroarylalkyl, $C_3$ to $C_{20}$ cycloalkyl, $C_3$ to $C_{15}$ cycloalkenyl, $C_6$ to $C_{15}$ cycloalkynyl, $C_5$ to $C_{15}$ heterocycloalkyl, or a combination including at least one of the foregoing, instead of hydrogen, provided that the substituted atom's normal valence is not exceeded.

The metal of the organometallic compound can be an alkali metal, an alkaline earth metal, an inner transition metal (a lanthanide or actinide), a transition metal, or a post-transition metal. In an embodiment, the metal of the organometallic compound is magnesium, aluminum, titanium, vanadium, chromium, manganese, iron, cobalt, nickel, zirconium, ruthenium, hafnium, tantalum, tungsten, rhenium, osmium, or a combination comprising at least one of the foregoing.

In an embodiment, the organometallic compound contains an aromatic ring such as an aryl or cyclopentadienyl group. Further, the organometallic compound can include multiple ring structures that bind to one or more metal atoms such as fulvalenediyl rings. In a further embodiment, the organometallic compound is a metallocene, for example, ferrocene, cobaltocene, nickelocene, ruthenocene, vanadocene, chromocene, decamethylmanganocene, decamethylrhenocene, or a combination of at least one of the foregoing, including dimers and oligomers thereof. As noted above, the metallocene can be substituted, e.g., as in methylcyclopentadienyl manganese tricarbonyl. In an alternative embodiment, the organometallic material can be a compound that contains a four-, five-, six-, seven-, eight-membered ring, or a combination thereof. Furthermore, the rings in the organometallic compound can be tilted so that the metal can accommodate acyclic ligands as well as more than two rings, for example, $W2(\eta^5-C_5C_5)_2(\eta^5-C_5H_4)_2H_2$.

Metallocene compounds can be obtained commercially or synthesized. A cyclopentadienide or its derivative can be reacted with sodium to form sodium cyclopentadienide. A solution containing the transition metal, for example, a solution of the halide salt of the transition metal, can be added to the sodium cyclopentadienide to produce the metallocene. Alternatively, substituted metallocenes that are "asymmetrical," for example, metallocenes having two different cyclopentadienyl ligands, can be obtained by reacting equimolar quantities of two different cyclopentadienides. A further alternative to produce asymmetrical metallocenes is to react an unsubstituted metallocene with an alkyl halide via Friedel Crafts alkylation to produce mono- and N,N'-dialkyl substituted metallocenes in the product mixture, the former being the asymmetrical metallocene. Each metallocene can be separated via separation technique known in the art such as distillation or flash chromatography. Metallocenes containing two or more substituents in one or both of the cyclopentadienyl rings may be made as described in U.S. Pat. No. 7,030,257, the disclosure of which is incorporated herein by reference in its entirety.

During the formation of deposit 20 on substrate 4, a metal cation from the organometallic material is reduced to a metal with an oxidation state of zero on substrate 4 by activating catalyst 28. Without wishing to be bound by theory, it is believed that the organometallic material dissociates whereby a bond between the ligand and the metal is broken in the organometallic material, and a metal cation is formed from the metal, which becomes part of the vapor deposition composition to be provided to activating catalys 28 on substrate 4. The metal cation is reduced to metal with a zero oxidation state at activating catalyst 28. In some embodiments, deposit 20 is an alloy of different metals, where the various metals are derived from a plurality of metal cationic species from different organometallic compounds. In an embodiment, ferrocene and cobaltocene are used so that a cobalt-iron (alloy) deposit 20 is formed. Furthermore, the size and composition of deposit 20 can be controlled by formation conditions, including temperature, pressure, and chemical concentrations, e.g., metal cation number density in the vapor deposition composition. In an embodiment, the primary reagent is the organometallic compound, e.g., triethylaluminum, that has a boiling point from 100° C. to 150° C. at one atmosphere of pressure.

According to an embodiment, the primary reagent is the metal salt. Here, formation of deposit 20 occurs, in an embodiment, by dissociating the primary reagent, i.e., the metal salt, into a metal cation and reducing anion from which the vapor deposition composition is composed. The vapor deposition composition then contacts substrate 4 en route to forming deposit 20 by a reduction-oxidation (redox) reaction involving the metal cation, i.e., reduction of the metal cation to a metallic state as deposit 20.

The metal salt indirectly provides the metal for producing the deposit 20 on substrate 4 by release of a metal cation from the metal salt. According to an embodiment, the metal salt includes a metal and neutral coordinating organic ligand or coordinating anion. In an embodiment, the ligand is an alkyl group, aryl group or other group described above in relation to the ligand in the organometallic compound. Here, "alkyl" refers to a normal-, secondary-, or tertiary-hydrocarbon having from 1 to 12 carbon atoms. Exemplary alkyl groups includes methyl, ethyl, 1-propyl, 2-propyl, 1-butyl, 2-methyl-1-propyl(i-Bu), 2-butyl (s-Bu) 2-methyl-2-propyl (t-Bu), 1-pentyl (n-pentyl), 2-pentyl, 3-pentyl, 2-methyl-2-butyl, 3-methyl-2-butyl, 3-methyl-1-butyl, 2-methyl-1-butyl, 1-hexyl, 2-hexyl, 3-hexyl, 2-methyl-2-pentyl, 3-methyl-2-pentyl, 4-methyl-2-pentyl, 3-methyl-3-pentyl, 2-methyl-3-pentyl, 2,3-dimethyl-2-butyl, 3,3-dimethyl-2-butyl, cyclopropyl, cyclobutyl, cyclopentyl, cyclohexyl, and the like. As used here, "aryl" refers to a 5- or 6-membered heterocyclic, oxyheterocyclic, or thioheterocyclic ring, including an arylalkyl, arylalkyloxy, arylalkylthio ring, and the like.

In some embodiments, the ligand is replaced by a coordinating solvent molecule (i.e., a solvent molecule with a donor atom) upon dissociation. In an embodiment, a ligand does not remain coordinated to the metal upon dissociating the metal salt, e.g., in presence of a solvent such as water.

In an embodiment, the metal salt includes a metal as a metal cation such that the vapor deposition composition efficiently provides for formation of deposit 20 on substrate 4. The metal salt can have a low melting point and sufficient thermal stability to dissociate and release the metal cation and the reducing anion in some embodiments.

According to an embodiment, the metal salt includes metal ion (M') complexed with neutral ligand (L) or a combination of neutral ligand (L) and negatively charged ligand (Y). In an embodiment, a combination of neutral ligands L and negatively charged ligands Y are included such that a total negative charge of the total number of negatively charged ligands Y is less than or equal to an oxidation state of metal ion $M^+$. The ligands (L or Y) can be weakly coordinating to facilitate their removal during dissociation of the primary reagent metal salt to provide metal cation $M^+$ and reducing anion (A−). Here, the ligands (L, Y) provide reducing anion A− upon dissociating the metal salt. Counter anions (X) can be weakly coordinating to reduce a melting point and to prevent direct binding to metal ion $M^+$. The liquid metal thus provides a metal source for deposit 20. At activating catalyst 28, metal ion $M^+$ is reduced to a metallic state to produce metal M of deposit 20. Electrons for reducing metal ion $M^+$ can be provided by substrate 4 or reducing anion A− from the ligands (L or Y) or counter anion X.

Exemplary metals M (of metal salt) that correspond to metal cation $M^+$ include copper, zinc, cadmium, nickel, cobalt, manganese, iron, chromium, tin, lead, bismuth, antimony, selenium, tellurium, thallium, silver, gold, platinum, palladium, rhodium, ruthenium, iridium, osmium, rhenium, aluminium, gallium, indium, silicium, germanium, beryllium, magnesium, titanium, zirconium, hafnium, molybdenum, tungsten, scandium, yttrium, lanthanum, cerium, praseodymium, neodymium, promethium, samarium, europium, gadolinium, terbium, dysprosium, holmium, erbium, thulium, ytterbium, lutetium, thorium, uranium, plutonium lithium, and the like.

Exemplary ligands L include a neutral ligand such as acetonitrile (AN), propionitrile, butyronitrile, isobutyronitrile, acrylonitrile, 2-hydroxycyanoethane, phenylacetonitrile, benzonitrile benzylnitrile, dimethylformamide (DMF), acetamide, N,N-dimethylacetamide, formamide, N-methylformamide, N-methylacetamide, dimethylsulfoxide (DMSO), dimethylsulfone ($DMSO_2$), hexamethylphosphoramide (HMPA), N-methylpyrrolidone (NMP), pyridine (Py), morpholine, tetrahydrofuran (THF), diethyl ether, dimethoxyethane (DME, monoglyme), bis(2-methoxyethyl) ether (diglyme), triglyme, tetraglyme, pentaglyme, hexaglyme, 1,4-dioxane, methanol, ethanol, propanol, butanol, ethyleneglycol, polyethyleneglycol, water, trialkylphosphine oxides, triarylphosphine oxides, trialkylphosphate, pyrazole, 3-alkylpyrazoles, 5-alkylpyrazoles, 3,5-dimethylpyrazole, imidazole, 1-alkylimidazoles, 1,2-dimethylimidazole, 2-imidazolidinone, thiabendazole, ammonia, tetramethylenesulfoxide (TMSO), urea, N,N,N',N'-tetramethylurea (TMU), thiourea, lactams, hydroxypyridines, 2-pyridone, pyridine-N-oxide, picoline-N-oxide, 2,6-lutidine, 2,6-lutidine N-oxide, pyrazine, pyrazine-N-oxide, 1,4-dithiane monosulfoxide, 2,2'-bipyridine (bipy), 1,10-phenanthroline (phen), 2,6,2',2"-terpyridine (terpy), ethylenediamine, diethylenetriamine, 1,2,3-triaminopropane, cyclam, crown ethers and thiacrown ethers, and the like.

Exemplary negatively charged ligands Y include chloride, bromide, iodide, thiocyanate, formate, acetate, trifluoroacetate, propionate, butyrate, pentanoate, hexanoate, benzoate, glycolate, heptafluorobutanate, alkylsulfate, octylsulfate, dodecylsulfate, triflate, methanesulfonate, nitrate, dicyanamide, tricyanomethanide, bis(trifluoromethylsulfonyl)imide (bistriflimide) or bis(perfluoroalkylsulfonyl)imide, dimethylphosphate, diethylphosphate, dialkylphosphate, saccharinate, acesulfamate tosylate, and the like.

Exemplary counter anions X include hexafluorophosphate, tetrafluoroborate, chloride, bromide, iodide acetate, trifluoroacetate, triflate, methanesulfonate, nitrate, perchlorate, dicyanamide, tricyanomethanide, bis(trifluoroalkylsulfonyl)imide, bis(trifluoromethylsulfonyl)imide (bistriflimide), bis(perfluoroalkylsulfonyl)imide, alkyltrifluoroborate, dimethylphosphate, diethylphosphate, dialkylphosphate tetrachloroaluminate, tetrachlorogallate, tetrachloroindate, tetrachloroferrate, hexachloroarsenate, hexachlorantimonate (VI), hexachlorotantalate, hexachloroniobate, and the like.

In an embodiment, a formula of the metal salt is $M^+LYX$, where $M^+$ is the metal ion metal; L is the neutral ligand; Y is the negatively charged ligand; and X is the counter anion. In some embodiments, e.g. when M+ has a charge of +1, Y is not present and the general formula of such liquid metal salt is $M^+LX$.

In a particular embodiment, the liquid metal salt includes metal-containing liquid metal salts that include a liquid metal salt of formula $[M^+L]X$, wherein $[M^+L]$ is a cation complex wherein M is the metal ion such as a cation of copper, zinc, cadmium, nickel, cobalt, manganese, iron, chromium, tin, lead, bismuth, antimony, selenium, tellurium, thallium, silver, gold, platinum, palladium, rhodium, ruthenium, iridium, osmium, rhenium, aluminum, gallium, indium, silicon, germanium, beryllium, magnesium, titanium, zirconium, hafnium, molybdenum, tungsten, scandium, yttrium, lanthanum, cerium, praseodymium, neodymium, promethium, samarium, europium, gadolinium, terbium, dysprosium, holmium, erbium, thulium, ytterbium, lutetium, thorium, uranium, plutonium, lithium, and the like; L is the neutral ligand such as acetonitrile (AN), propionitrile, butyronitrile, isobutyronitrile, acrylonitrile, 2-hydroxycyanoethane, phenylacetonitrile, benzonitrile benzylnitrile, dimethylformamide (DMF), acetamide, N,N-dimethylacetamide, formamide, N-methylformamide, N-methylacetamide, dimethylsulfoxide (DMSO), dimethylsulfone ($DMSO_2$), hexamethylphosphoramide (HMPA), N-methylpyrrolidone (NMP), pyridine (Py), morpholine, tetrahydrofuran (THF), diethyl ether, dimethoxyethane (DME, monoglyme), bis(2-methoxyethyl) ether (diglyme), triglyme, tetraglyme, pentaglyme, hexaglyme, 1,4-dioxane, methanol, ethanol, propanol, butanol, ethyleneglycol, polyethyleneglycol, water, trialkylphosphine oxides, triarylphosphine oxides, trialkylphosphate, pyrazole, 3-alkylpyrazoles, 5-alkylpyrazoles, 3,5-dimethylpyrazole, imidazole, 1-alkylimidazoles, 1,2-dimethylimidazole, 2-imidazolidinone, thiabendazole, ammonia, alkylamines, tetramethylenesulfoxide (TMSO), urea, N,N,N',N'-tetramethylurea (TMU), thiourea, lactams, hydroxypyridines, 2-pyridone, pyridine-N-oxide, picoline-N-oxide, 2,6-lutidine, 2,6-lutidine N-oxide, pyrazine, pyrazine-N-oxide, 1,4-dithiane monosulfoxide, 2,2'-bipyridine (bipy), 1,10-phenanthroline (phen), 2,6,2',2"-terpyridine (terpy), ethylenediamine, diethylenetriamine, 1,2,3-triaminopropane, cyclam, crown ethers and thiacrown ethers, and the like; and X is the counter anion such as hexafluorophosphate, tetrafluoroborate, chloride, bromide, iodide acetate, trifluoroac.etate, triflate, methanesulfonate, nitrate, perchlorate, dicyanamide, tricyanomethanide, bis(trifluoroalkylsulfonyl)imide, bis(trifluoromethylsulfonyl)imide (bistriflimide), bis(perfluoroalkylsulfonyl)imide, alkyltrifluoroborate, dimethylphosphate, diethylphosphate, dialkylphosphate tetrachloroaluminate, tetrachlorogallate, tetrachloroindate, tetrachloroferrate, hexachloroarsenate, hexachlorantimonate (VI), hexachlorotantalate, hexachloroniobate, and the like.

In a particular embodiment, the liquid metal salt includes negatively charged ligand Y and has a formula $[M^+LY]X$, wherein [M+LY] is a cation complex; X is the counter anion; M+ is the metal cation of a metal such as copper, zinc, cadmium, nickel, cobalt, manganese, iron, chromium, tin, lead, bismuth, antimony, selenium, tellurium, thallium, silver, gold, platinum, palladium, rhodium, ruthenium, iridium, osmium, rhenium, aluminum, gallium, indium, silicon, germanium, beryllium, magnesium, titanium, zirconium, hafnium, molybdenum, tungsten, scandium, yttrium, lanthanum, cerium, praseodymium, neodymium, promethium, samarium, europium, gadolinium, terbium, dysprosium, holmium, erbium, thulium, ytterbium, lutetium, thorium, uranium, plutonium, lithium, and the like; L is the neutral ligand such as acetonitrile (AN), propionitrile, butyronitrile, isobutyronitrile, acrylonitrile, 2-hydroxycyanoethane, phenylacetonitrile, benzonitrile benzylnitrile, dimethylformamide (DMF), acetamide, N,N-dimethylacetamide, formamide, N-methylformamide, N-methylacetamide, dimethylsulfoxide (DMSO), dimethylsulfone ($DMSO_2$), hexamethylphosphoramide (HMPA), N-methylpyrrolidone (NMP), pyridine (Py), morpholine, tetrahydrofuran (THF), diethyl ether, dimethoxyethane (DME, monoglyme), bis(2-methoxyethyl) ether (diglyme), triglyme, tetraglyme, pentaglyme, hexaglyme, 1,4-dioxane, methanol, ethanol, propanol, butanol, ethyleneglycol, polyethyleneglycol, water, trialkylphosphine oxides, triarylphosphine oxides, trialkylphosphate, pyrazole, 3-alkylpyrazoles, 5-alkylpyrazoles, 3,5-dimethylpyrazole, imidazole, 1-alkylimidazoles, 1,2-dimethylimidazole, 2-imidazolidinone, thiabendazole, ammonia, alkylamines, tetramethylenesulfoxide (TMSO), urea, N,N,N',N'-tetramethylurea (TMU), thiourea, lactams, hydroxypyridines, 2-pyridone, pyridine-N-oxide, picoline-N-oxide, 2,6-lutidine, 2,6-lutidine N-oxide, pyrazine, pyrazine-N-oxide, 1,4-dithiane monosulfoxide, 2,2'-bipyridine (bipy), 1,10-phenanthroline (phen), 2,6,2',2"-terpyridine (terpy), ethylenediamine, diethylenetriamine, 1,2,3-triaminopropane, cyclam, crown ethers, thiacrown ethers, and the like; Y the negative ligand such as chloride, bromide, iodide, thiocyanate, formate, acetate, trifluoroacetate, propionate, butyrate, pentanoate, hexanoate, benzoate, glycolate, heptafluorobutanate, alkylsulfate, octylsulfate, dodecylsulfate, triflate, methanesulfonate, nitrate, dicyanamide, tricyanomethanide, bis(trifluoromethylsulfonyl)imide (bistriflimide) or bis(perfluoroalkylsulfonyl)imide, dimethylphosphate, diethylphosphate, dialkylphosphate, saccharinate, acesulfamate, tosylate, and the like; and X is the counter anion such as hexafluorophosphate, tetrafluoroborate, chloride, bromide, iodide acetate, trifluoroacetate, triflate, methanesulfonate, nitrate, perchlorate, dicyanamide, tricyanomethanide, bis(trifluoroalkylsulfonyl)imide, bis(trifluoromethylsulfonyl)imide (bistriflimide), bis(perfluoralkylsulfonyl)imide, methyltrifluoroborate, alkyltrifluoroborate, diethylphosphate, dialkylphosphate, tetrachloroaluminate, tetrachlorogallate, tetrachloroindate, tetrachloroferrate, hexachloroarsenate, hexachlorantimonate (VI), hexachlorotantalate and hexachloroniobate, and the like.

Exemplary metal salts include copper(I) tetrakis(acetonitrile), bis(trifluoromethylsulfonyl)imide, copper(I) tetrakis(methylimidazole), bis(trifluoromethylsulfonyl)imide, copper(I) tetrakis(butylimidazole), bis(trifluoromethylsulfonyl) imide, copper(I) bis(2,2'-bipyridine), bis (trifluoromethylsulfonyl)imide, copper(I) tetrakis(pyridine), bis(trifluoromethylsulfonyl)imide, copper(I) tetrakis(3-picoline), bis(trifluoromethylsulfonyl)imide, copper(I) tetrakis (benzonitrile), bis(trifluoromethylsulfonyl)imide, zinc(II) bis(trifluoromethylsulfonyl)imide hexahydrate, silver(I) tetrakis(acetonitrile)bis(trifluoromethylsulfonyl)imide, silver (I) tris(acetonitrile)bis(trifluoromethylsulfonyl)imide, silver (I) (acetonitrile), bis(trifluoromethylsulfonyl)imide, silver(I) bis(acetonitrile), bis(trifluoromethylsulfonyl)imide, silver(I) mono(acetonitrile), bis(trifluoromethylsulfonyl)imide, copper(I) tetrakis(methylimidazole), trifluoromethanesulfonate, silver(I) tetrakis(acetonitrile), bis(trifluoromethylsulfonyl)imide, silver(I) tris(acetonitrile), bis(trifluoromethylsulfonyl)imide, silver(I) (acetonitrile), silver(I) bis (acetonitrile), bis(triflupromethylsulfonyl)imide and silver (I)mono(acetonitrile), bis(trifluoromethylsulfonyl)imide, and the like.

The metal salt can be prepared synthetically by a method known in the art or obtained from a commercial source.

According to an embodiment, etch void 6, coating 22, and deposit 20 are formed by etching substrate 4 or depositing deposit 20 on substrate 4. In an embodiment, a process for etching or depositing includes metal-assisted chemical etching described or metal-assisted deposition described in Hildreth et al., "Effect of Catalyst Shape and Etchant Composition on Etching Direction in Metal-Assisted Chemical Etching of Silicon to Fabricate 3D Nanostructures," ACS Nano 3, 4033 (2009); Hildreth et al., "3D Out-of-Plane Rotational Etching with Pinned Catalysts in Metal-Assisted Chemical Etching of Silicon," Adv. Funct. Mater. 21, 3119 (2011); Hildreth et al., "Combining Electroless Filling with Metal-Assisted Chemical Etching to Fabricate 3D Metallic Structures with Nanoscale Resolutions," ECS Solid State Lett. 2, P30 (2013); or Hildreth et al., "Vapor Phase Metal-Assisted Chemical Etching of Silicon," Adv. Funct. Mater. 24, 3827 (2014), the disclosure of each of which is incorporated herein by reference in its entirety.

In an embodiment, coating 22 having a uniform density gradient is controllably formed in substrate 4. Here, a plurality of activating catalysts 28 that includes, e.g., different activating catalyst 28 with different sizes of activating catalyst 28 are used to etch a plurality of different depths in substrate 4. Etching can occur in a single etch step or a selected number of steps. Activating catalyst 28 (e.g., Ag, Au, Pt, or Pd) is disposed on substrate 4 (e.g., silicon), and substrate 4 with activating catalyst 28 disposed thereon is immersed in liquid medium 30, e.g., a composition that includes an activatable etchant (e.g., HF) and etchant oxidizer (e.g., $H_2O_2$). Metal of activating catalyst 28 is a catalyst that reduces the etchant oxidizer. Without wishing to be bound by theory, it is believed that reducing the etchant oxidizer injects holes ($h^+$) into substrate 4 to produce a hole ($h^+$)-rich region in substrate 4 proximate to activating catalyst 28. This hole ($h^+$) rich region is oxidized by the activatable etchant (e.g., HF) to form etchant product 32 (e.g., $SiF_6^{2-}$, $H_2SiF_6$, and the like). Etchant product can be soluble and removed by solvating etchant product 32 in liquid medium 30 or in a rinse composition, e.g., distilled water or alcohol. Formation of additional etchant product 32 proceeds as activating catalyst 28 moves and propagates in substrate 4. In this manner, the motion of activating catalyst 28 provides high feature resolution of etch void 6 even when etch void 6 has an ultra-high aspect ratio.

Thus, it is contemplated that the activatable etchant may not etch substrate 4 (e.g., undamaged silicon) at an appreciable rate. For this purpose, activating catalysts 28 catalyzes reduction of etchant oxidizer (e.g., $H_2O_2$) to consume electrons from substrate 4 and injects holes ($h^+$) into a valance band of substrate 4. As a result, in a particular embodiment, such a process creates a hole ($h^+$) rich region of silicon surrounding activating catalyst 28 that is oxidized by HF to form soluble $SiF_6^{2-}$ and $H_2SiF_6$ with the reaction continuing as activating catalyst 28 is pulled into substrate 4 by van der Waals or electrostatic forces. Without wishing to be bound by theory, it is believed that activating catalyst 28 produces a localized, traveling galvanic etching reaction to produce one-dimensional, two-dimensional, or three-dimensional nanostructures or microstructures in substrate 4. Accordingly, since activatable etchant may not etch substrate 4 and is appreciable rate, activating catalyst 28 activates the activatable etchant to etch substrate 4 in a presence of the etchant oxidizers.

In a particular embodiment, the process includes etching substrate 4 wherein activating catalyst 28 (e.g., silver) is deposited onto substrate 4 (e.g., silicon) and contacted by liquid medium 30 that includes the activatable etchant (e.g., hydrofluoric acid) and etchant oxidizer (e.g., hydrogen peroxide) to initiate redox reactions that include cathodic and anodic redox reactions as described in Hildreth et al., U.S. Pat. No. 8,278,191, granted Oct. 2, 2012, the disclosure of which is incorporated herein in its entirety.

Figure 12A:
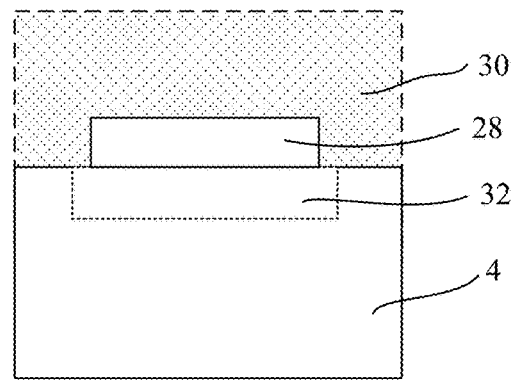
FIGS. 12A, 12B, and 12C shows formation of an etch void in a substrate.
Figure 12B:
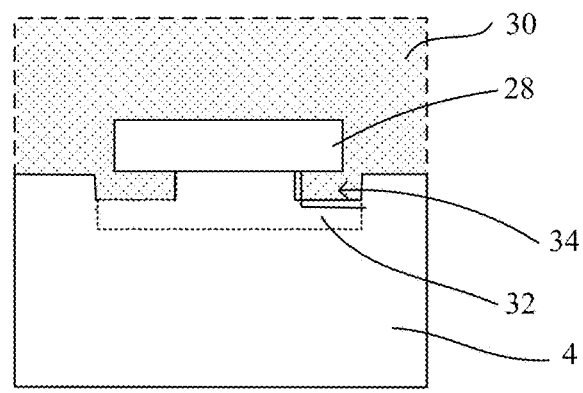
Figure 12C:
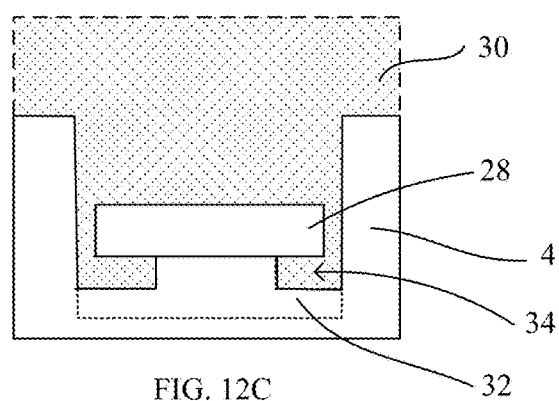

In an embodiment, a shown in FIGS. 12A, 12B, and 12C, a process for forming coating 22 includes disposing activating catalyst 28 on substrate 4, introducing the activatable etchant, introducing the etchant oxidizer, and performing an oxidation-reduction reaction between substrate 4, the activatable etchant, and the etchant oxidizer in a presence of activating catalyst 28 such that the oxidation-reduction reaction occurs in presence of liquid medium 30. Liquid medium 30 includes the activatable etchant and the etchant oxidizer. The process further includes forming etchant product 32 (that includes a plurality of atoms from substrate 4), removing a portion of etchant product 32 from substrate 4 to form undercut 34 interposed between activating catalyst 28 and substrate 4, and forming a dendritic vein (not shown in FIG. 12A, 12B, or 12C but see FIGS. 7 and 8) in substrate 4 to form coating 20 (not shown). The dendritic veins are anisotropically disposed in the coating. As used herein, "anisotropically" refers to an absence of a point, line, or plane of symmetry of the dendritic veins such that etch voids 6 are not substantially identical in an arrangement disposal of etch voids 6 in substrate 4, as shown in FIGS. 7 and 8.

Figure 13:
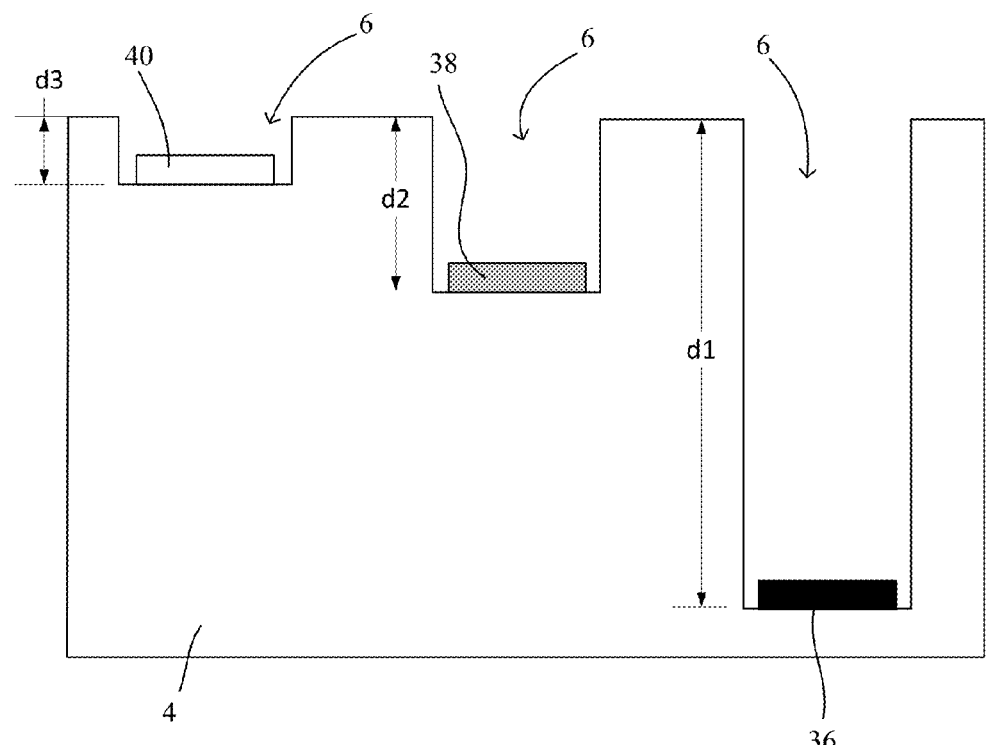
FIG. 13 show a plurality of activating catalysts disposed on a substrate and having different etch rates.

In an embodiment, as shown in FIG. 13, a plurality of different activating catalysts, i.e., first activating catalyst 36, second activating catalyst 38, third activating catalyst 40, and the like, are disposed on substrate 4 to produce etch voids 6 having a plurality of different depths (respectively, first depth d1, second depth d2, third depth d3, and the like) in substrate 4. In a particular embodiment, first activating catalyst 36, second activating catalyst 38, and third activating catalyst 40 have a different rate for forming etch voids 6. In a specific embodiment, first activating catalyst 36, second activating catalyst 38, and third activating catalyst 40 independently include Ag, Au, or Pt that respectively have an etch rate of 5 nm/sec (Ag), 50 nm/sec (Au), and 1,000 nm/sec (Pt) in silicon.

Figure 14:
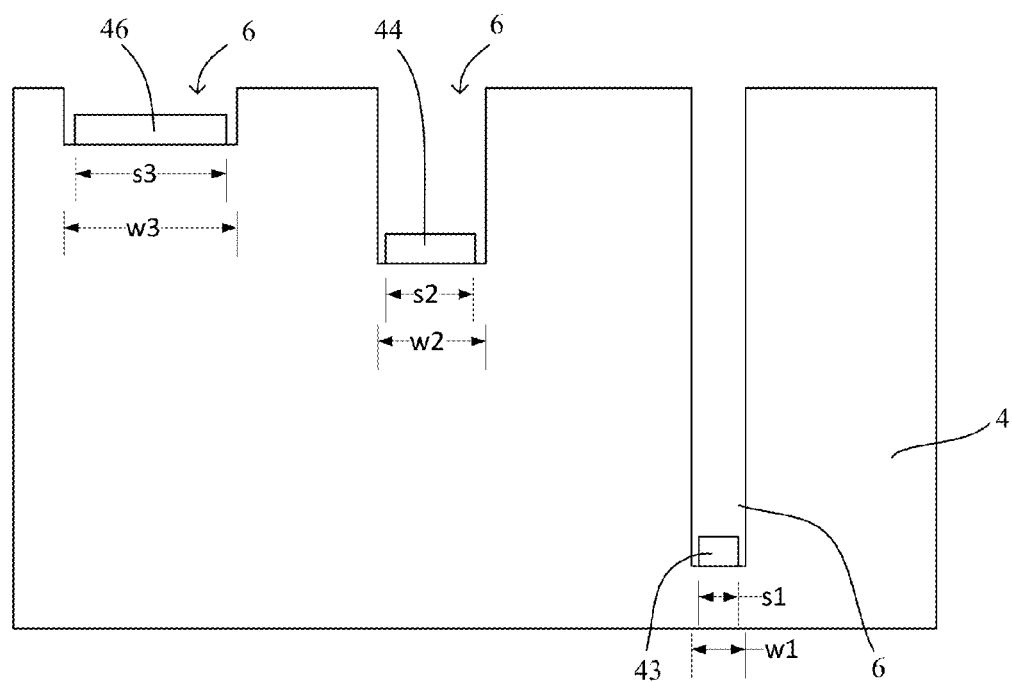
FIG. 14 shows a plurality of activating catalysts that have different sizes.

In an embodiment, as shown in FIG. 14, a plurality of activating catalysts, i.e., first activating catalyst 43, second activating catalyst 44, third activating catalyst 46, and the like, are disposed on substrate 4 to produce etch voids 6. Here, first activating catalyst 43, second activating catalyst 44, and third activating catalyst 46 have different sized, respectively shown as first size S1, second size S2, and third size S3, from smallest to largest size. Size here can be a largest cross-sectional linear dimension or area. By virtue of differing size, first activating catalyst 43, second activating catalyst 44, and third activating catalyst 46 produce etch voids 6 having a plurality of widths, respectively first width W1, second width W2, and third width W3. It is contemplated that first activating catalyst 43 having a smaller size (first size S1) produces etch void 6 that has a greater depth in substrate four than etch void 6 formed by second activating catalyst 44 or third activating catalyst 46 that have a larger size than first activating catalyst 43. Without wishing to be bound by theory, it is believed that an etch rate of activating catalyst 28 (e.g., first activating catalyst 43, second activating catalyst 44, third activating catalyst 46) varies inversely with size S (i.e., $1/S^3$).

Figure 15:
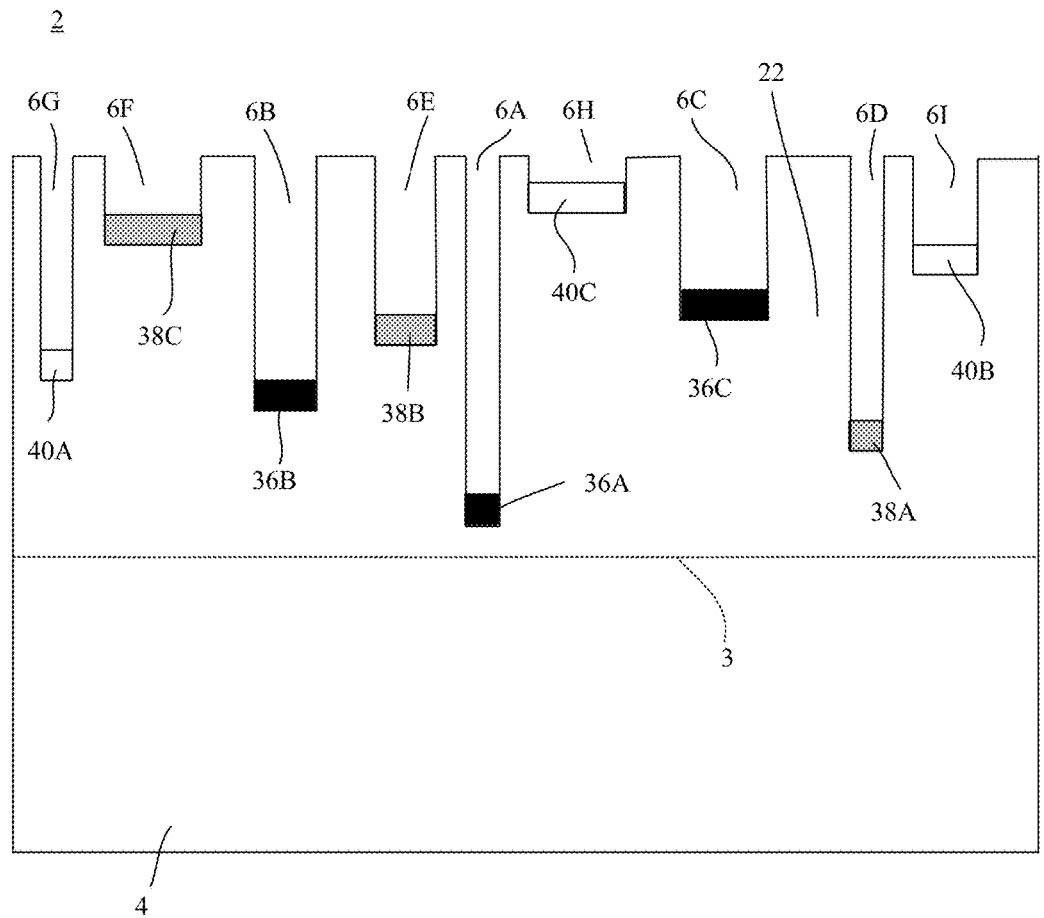
FIG. 15 shows plurality of etch voids disposed in a substrate and a plurality of different activating catalyst disposed in various etch voids.

According to an embodiment, with reference to FIG. 15, coating 22 is formed from substrate 4 from interaction of the activatable etchant and etchant oxidizer with first activating catalysts (36A, 36B, 36C), second activating catalysts (38A, 38B, 38C), and third activating catalyst (40A, 40B, 40C) having different identities (i.e., metal composition) and sizes to produce a plurality of etch voids (6A, 6B, 6C, 6D, 6E, 6F, 6G, 6H, 6I) having different shapes and depths. Here, a density gradient is etched into substrate 4 by selectively disposing activating catalysts (36A, 36B, 36C, 38A, 38B, 38C, 40A, 40B, 40C) on substrate 4 to etch the plurality of etch voids (6A, 6B, 6C, 6D, 6E, 6F, 6G, 6H, 6I). As such, a density gradient in a volume of a material of substrate 4 is created activating catalysts (36A, 36B, 36C, 38A, 38B, 38C, 40A, 40B, 40C) in combination with the activatable etchand and etchant oxidizer etch a different depth into substrate 4. That is, coating 22 (top portion of article 2 above fudicial line 3) is heavily etched and very porous (porosity not shown in FIG. 15—but see FIGS. 7 and 8) with and increasing density as number density of activating catalysts (36A, 36B, 36C, 38A, 38B, 38C, 40A, 40B, 40C) decreases with depth into substrate 4. Here, coating 22 nominally terminates at fudicial line 3 (which would be a surface in three-dimensional space). Also, larger sized activating catalysts (e.g., 36C, 38C, 40C) have a slower etch rate than small-sized activating catalysts (e.g., 36A, 38A, 40A). It is contemplated that different activating catalysts (e.g., Ag compared with Pt) or activating catalysts having different sizes produce a density gradient within in substrate 4.

With reference again to FIGS. 7 and 8, activating catalyst 28 moves in in a three-dimensional volume in substrate 4 as substrate 4 is etched. This motion of activating catalyst 28 in the three-dimensional volume is controlled in an embodiment, e.g., by application of an external electric field. According to an embodiment, etching substrate 4 includes dynamically changing when activating catalyst 28 etches in a vertical direction (relative to a surface of substrate 4 from which activating catalyst 28 was disposed on substrate 4) to remove comparatively little substrate material per unit depth of substrate 4. Further, etching substrate 4 includes dynamically changing when activating catalyst 28 and etches in lateral direction (relative to a surface of substrate 4 from which activating catalyst 28 was disposed on substrate 4) to remove comparatively more material per unit depth of substrate 4. In some embodiments, these three features are used in combination or independently such that a plurality of different activating catalysts having different sizes that move along a plurality of different etching paths produces a uniform gradient in coating 22 as shown in FIGS. 7 and 8.

In an embodiment, etching substrate 4 produces gas (e.g., $H_2$) that can be disposed initially as bubbles in substrate 4. Certain bubbles of the gas can interconnect within the forming coating 22. In this manner, a plurality of dendritic veins is anisotropically disposed in coating 22. Further, evolution of the gas produces a microporous layer of the material of substrate 4 as coating 22 is formed from the same material that composes substrate 4. Accordingly, a gradient in a density of a volume of the microporous layer is produced by virtue of a plurality of different activating catalysts having different sizes and composition producing the microporous layer with a terminal depth of the plurality of the activating catalysts being different in various portions of coating 22. In a certain embodiment, the process includes forming the gradient in the density of the volume of coating 22. Additionally, the process includes controlling an index of refraction of the coating to produce the coating with a uniform gradient in the index. Moreover, the process can include changing a condition to affect a condition (e.g., temperature, concentration of etchant oxidizer or activatable etchant, and the like) of coating 22. The redox reaction can be terminated controllably by quenching etching of substrate 4 (e.g., by removing ethant oxidizer, introducing a catalyst poisoner, and the like). In some embodiments, the redox reaction terminates by reacting substantially all of a limiting reactant (e.g., etchant oxidizer or activatable etchant). According to an embodiment, the process includes removing activating catalyst 28 from contact with substrate 4 to produce article 2. In a certain embodiment, the process includes washing article 2 to remove etchant product 32 to expose etch void 6, e.g., dendritic veins 24.

In an embodiment, a reflectivity of coating 22 is controlled to be a certain value or to have a range of values across a surface of coating 22.

With regard to removing activating catalyst 28 from etch void 6, in an embodiment, after etch void 6 is formed (or when activating catalyst 28 is left as a residual material on a surface of coating 22), activating catalyst 28 (e.g., Pt) remains in etch void 6, which may be open or closed cell pores, dendritic vein 24, or open and exposed etch void 6. Some of activating catalysts 28 may be distributed throughout coating 22. Such activating catalyst 28 can be removed from coating 22 after the formation process. A leaching process can be used to remove at least a portion or substantially all of activating catalyst 28 from etch voids 6. As used herein, "substantially all" means having a total amount of activating catalyst 28 in coating 22 of article 2 of less than about 5 wt. %, specifically less than or equal to about 4 wt. %, still more specifically less than or equal to about 0. Wwt. %, based on the weight of activating catalyst 28 per unit volume of leached region of article 2.

In one embodiment, the polycrystalline diamond may be leached using a leaching agent and process such as those described more fully in, for example, U.S. Pat. No. 5,127,923 and U.S. Pat. No. 4,224,380, the disclosure of each of which patent is incorporated herein by reference in its entirety.

For example, aqua regia, which is a mixture of concentrated nitric acid ($HNO_3$) and concentrated hydrochloric acid (HCl), in any effective proportion such as, for example, in a 1:3 (v/v) ratio, may be used to at least remove substantially all activating catalyst 28 from etch voids 6. Alternatively, boiling hydrochloric acid (HCl) may be used as the leaching agent. In an exemplary embodiment, a useful leaching agent is hydrochloric acid (HCl) heated to a temperature of greater than 110° C., which may be provided in contact with article 2 for 5 minutes in to 1,000 hours or even greater, depending upon the size of article 2, and the extent of leaching desired in coating 22. In some embodiments an organic aqua regia is used to remove activating catalyst 28. An exemplary organic regia is described in U.S. patent application Ser. No. 13/820,358, which is incorporated by reference in its entirety.

In an embodiment, leaching comprises immersing article 22 (or a portion thereof, e.g., coating 22) in a leaching agent (e.g., hydrochloric acid, nitric acid, or a combination thereof) at a temperature effective to remove activating catalyst 28, e.g., at a temperature greater than or equal to 20° C. After leaching the activating catalyst 28 from coating 22, article 2 may be free of substantially all activating catalyst 28 used to catalyze formation of etch voids 6.

According to an embodiment, coating 22 is formed by an electrochemical process. Here, a process for forming a coating includes disposing activating catalyst 28 on substrate 4, introducing the activatable etchant, subjecting activating catalyst 28 and the activatable etchant to an electric potential, and performing an electrochemical reaction between substrate 4 and the activatable etchant in a presence of activating catalyst 28 and the electric potential. The electrochemical reaction occurs in liquid medium 30 that includes the activatable etchant and the etchant oxidizer. The process further includes forming etchant product 32 that includes a plurality of atoms from substrate 4, removing a portion of etchant product 32 from substrate 4, and forming a plurality of dendritic veins 24 in substrate 4 to form coating 22. The plurality of dendritic veins 24 are anisotropically disposed in coating 22. The electric potential has a magnitude effective to reduce activatable etchant at activating catalyst 28 and to form etchant product 32 from the activatable etchant and substrate 4. In an embodiment, the process includes removing etchant product 32 from dendritic veins 24. In some embodiments, etchant product 32 is maintained in etch voids 6 and not removed.

According to an embodiment, a controllable density gradient is formed in a substrate (e.g., silicon) using a liquid composition having the activatable etchant in presence of activating catalyst 28 on substrate 4. The density gradient can be controlled by adjusting a material of activating catalyst 28; adjusting a size of activating catalyst 28; changing a path of motion of activating catalyst 28 and substrate 4; changing components in liquid medium 30; and the like. Surface etching can be enhanced by adjusting an identity of the activatable etchant or etchant oxidizer. It is contemplated that etch void 6 can have a one-dimensional, two-dimensional, or three-dimensional structure in substrate 4 such as silicon or other III-IV-V semiconductors using patterned or deposited activating catalysts 28 on substrate 4 followed by exposure to liquid medium 30 that includes the activatable etchant (e.g., HF) or oxidizing agent such as $H_2O_2$. It is contemplated that etching path (i.e., motion of activating catalyst in substrate 40) is controlled by selection of the shape of activating catalyst 28; application of an external fields (e.g., a magnetic field, electric field, or combination thereof); adjustment of concentration of activatable etchant, etchant oxidizer, or combination thereof (e.g., HF or $H_2O_2$); and the like. Resolution during the etching and of etch void 6 is controlled by adjusting activating catalysts 28 identity (i.e., metallic species), shape, composition, and the like; adjusting concentration of the activatable etchant; adjusting concentration of the etchant oxidizer; and the like.

In an embodiment, article 2 includes coating 22, or and coating 22 is an anti-reflective coating. Such antireflective coatings can be implemented in a detector for microwave frequencies, e.g., a detector in a telescope. Although conventional techniques use dicing or deep reactive ion etching that can be slow, expensive, or create one or two discrete densities in a substrate, the process herein surprisingly provide continuous density gradients of an arbitrary gradient and depth at low monetary and time cost. Advantageously, processes herein etch services that are later, a regular, curved, and the like without limitation to surface curvature. As such, the processes herein can etch a vast variety of substrates to form lenses (planar and curved), containers, through holes, blind holes, tailorable apertures, undulating surface contouring, and the like.

In an embodiment, etching substrate 4 is accomplished using a vapor composition that comprises the activatable etchant. With reference to FIGS. 16A, 16B, 16C, and 16D, a process for etching substrate 4 includes disposing activating catalyst 28 on substrate 4; providing vapor composition 42 comprising an etchant oxidizer, an activatable etchant, or a combination thereof to substrate 4, activating catalyst 28, or a combination thereof; contacting activating catalyst 28 with the etchant oxidizer, contacting substrate 4 with the activatable etchant; performing an oxidation-reduction reaction between substrate 4, the activatable etchant, and the etchant oxidizer in a presence of activating catalyst 28 and vapor composition 42; forming etchant product 32 that includes a plurality of atoms from substrate 4; and removing etchant product 32 from substrate 4 to etch substrate 4. During providing vapor composition 42 to substrate 4 or activating catalyst 28, vapor composition 42 and Sorbs two substrate 4 or activating catalyst 28 to form etchant adsorbent 50. Etchant adsorbent 50 includes the etchant oxidizer and activatable etchant, e.g., in a thin layer such that etchant product 32 is formed efficiently. In this manner, etchant product 32 can be formed from a relatively low vapor pressure liquid medium 30 so that although vapor composition 42 may not have a high number density, etch adsorbent 50 includes a high number density of the activatable etchant or etchant oxidizer. Furthermore, in an embodiment, vapor composition 42 can be continually provided to substrate 4 or activating catalyst 28. In some embodiments, vapor composition 42 is modulated to provide a temporally varying amount of the activatable etchant or etchant oxidizer two substrate 4 or activating catalyst 28. According to an embodiment, a plurality of liquid media 30 is present in separate containers such that different or redundant streams of vapor composition 42 can be provided to substrate 4 or activating catalyst 28.

Figure 16A:
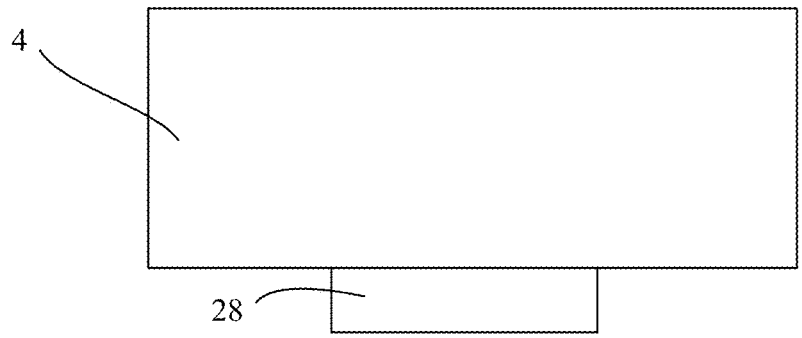
FIGS. 16A, 16B, 16C, and 16D show formation of an etch void in a substrate.
Figure 16B:
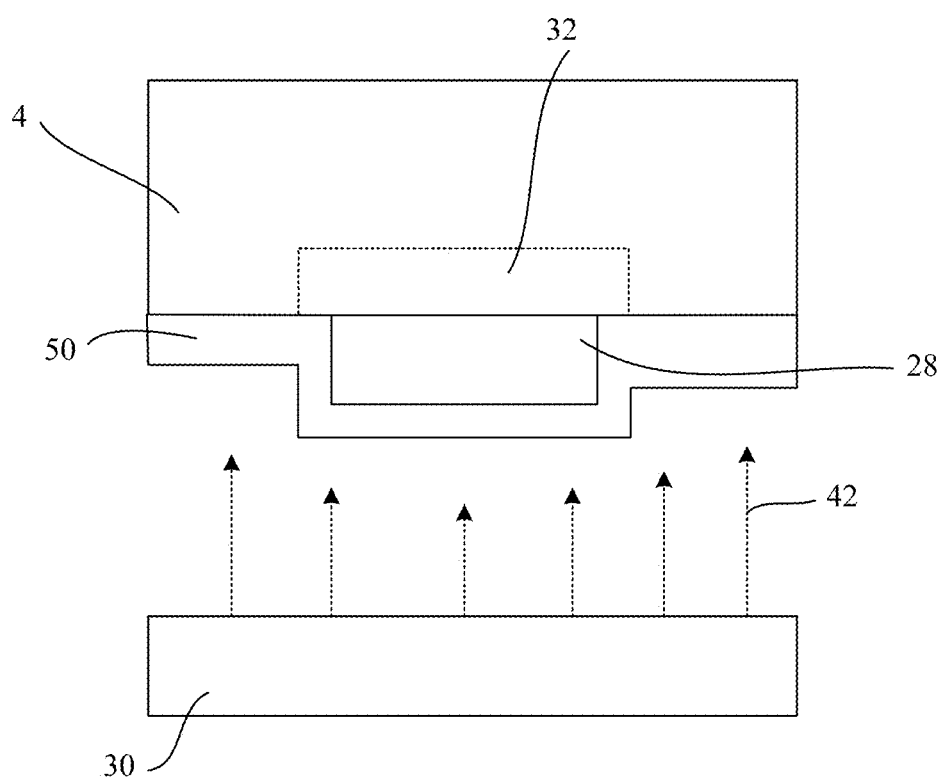
Figure 16C:
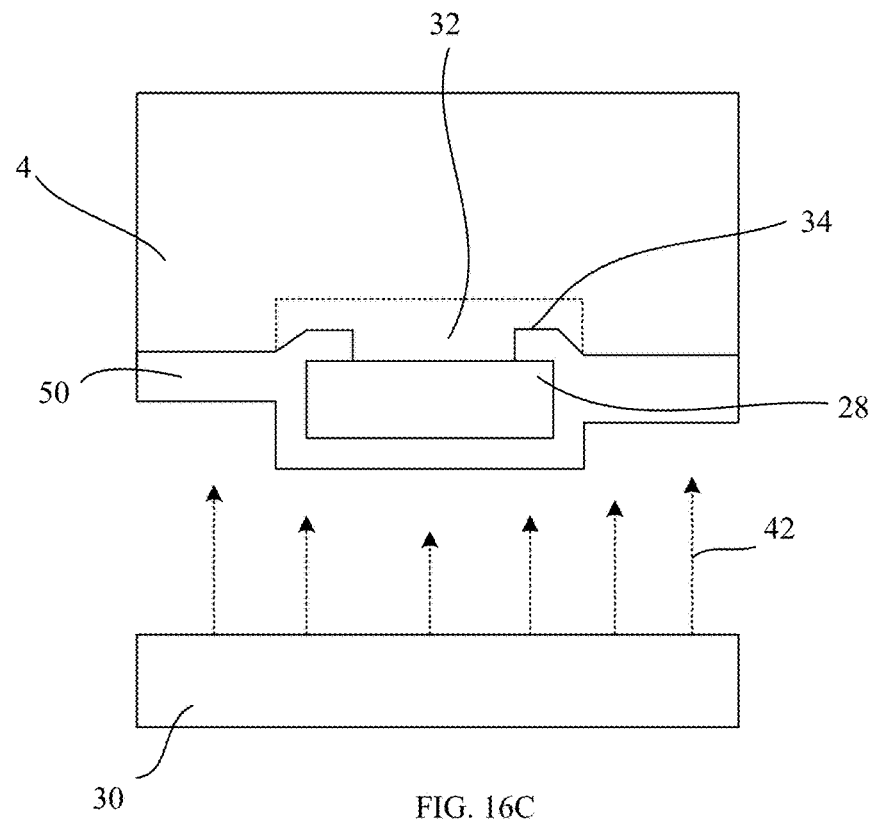
Figure 16D:
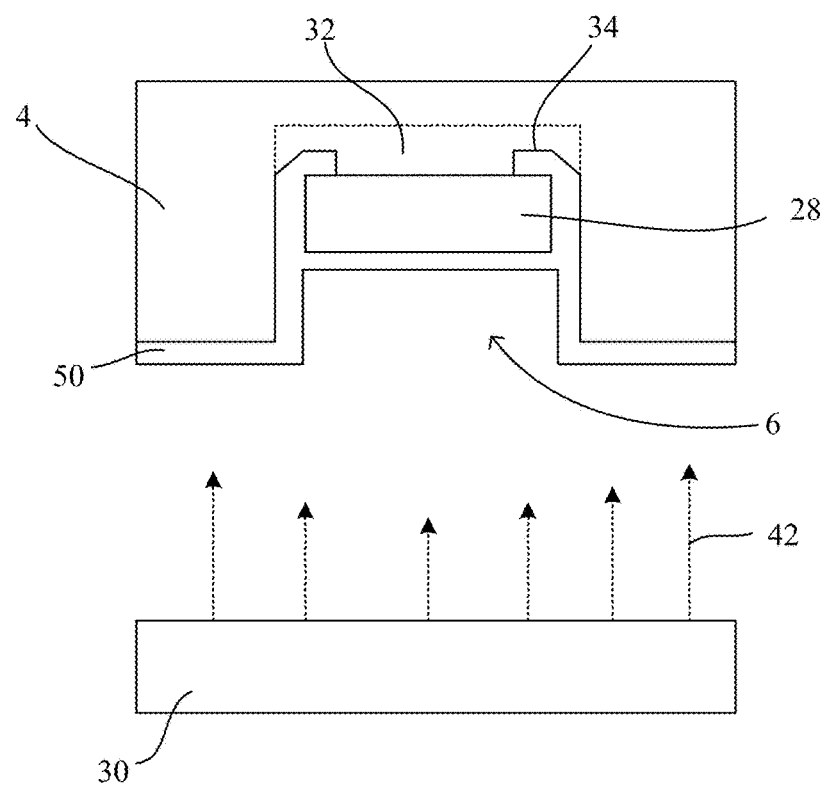

As shown in FIGS. 16B and 16C, as etchant product 32 is produced by interaction of components of etch adsorbent 50 with activating catalyst 28 and substrate 4, undercut 34 is made in substrate 4 by removal of etchant product 32 from substrate 4. In this manner, atoms from substrate 4 are etched away by components of etch adsorbent 50 in presence of substrate 4 and activating catalyst 28. FIG. 16 D shows accumulation of removal of atoms of substrate 4 such that etch void six is produced in substrate four by cumulative removal of etch product 32.

In an embodiment, the process further includes adjusting a position of activating catalyst 28 in substrate 4, e.g., by using an external field such as a magnetic field or an electric field as etchant product 32 is removed. In some embodiments, a position of activating catalyst 28 as etch void 6 is formed is controlled by physically altering a position of activating catalyst 28 such as by tethering a portion of activating catalyst 28 to external portion of substrate 4 or an exterior member that may or may not be attached to substrate 4. In this manner, the exterior member can serve as anchor to control the position of activating catalyst 28 or a path of travel of activating catalyst 28 in substrate 4 as etch void 6 is formed. As a result of controlling a position of activating catalyst 28 during etching of substrate 4, a shape of etch void 6 corresponds to a cumulative position of activating catalyst 28 in substrate 6. The process can further include controlling a rate of forming etch product 32. The rate can include isolating activating catalyst 28 from the etchant oxidizer, substrate 4 from activatable etchant 28, or a combination thereof. In an embodiment, isolating is conducted intermittently. As used herein, "intermittently" refers to stopping or ceasing for a time or alternately ceasing and beginning again. In some embodiments, controlling the rate includes changing a rate of formation of etch product 32. Alternatively, controlling the rate can include maintaining the rate of formation of etch product 32 at a substantially constant rate.

It is contemplated that, in this process, etch void 6 is a one-dimensional etch void, a two-dimensional etch void, a three-dimensional etch void, or a combination comprising at least one of the foregoing etch voids in substrate 4 as a result of adjusting a position of activating catalyst 28 in substrate 4. In an embodiment, the process also includes forming dendritic vein 24 in substrate 4 to form coating 22 such that dendritic vein 24 is anisotropically disposed in coating 22. Substrate 4 can include a plurality of etch voids 6 formed in substrate 4 of a single etch void 6. For the plurality of etch voids 6, substrate 4 can have a gradient in a density of a volume of substrate 4 due to a presence of the plurality of etch voids 6. Here, etch voids 6 can have an arbitrary shape by virtue of controlling a position of activating catalyst 28 during etching using the vapor composition. In an embodiment, substrate 4 includes the plurality of etch voids 6 arranged such that substrate 4 has a uniform density of a volume of substrate 4 due to a presence of the plurality of etch voids 6.

In some embodiments, activating catalyst 28 is disposed on a surface of substrate 4 in a selected pattern. In a particular embodiment, activating catalyst 28 is disposed on a surface of substrate four in a random pattern. In a certain embodiment, activating catalyst 28 is disposed on the surface of substrate 4 through a mask. Activating catalyst 28 can be disposed on the surface of substrate 4 by entraining activating catalyst 28 in a gas and delivering the gas containing activating catalyst 28 to the surface of substrate 4. Alternatively, activating catalyst 28 can be disposed on the surface of substrate 4 by disposing activating catalyst 28 and a liquid delivering the liquid containing activating catalyst 28 to the surface of substrate 4. Such delivery can be accomplished by spraying, spinning, knife-blading, and the like the liquid containing activating catalyst 28 on the surface of substrate 4. In an embodiment, substrate 4 can be immersed in liquid containing activating catalyst 28 whereby activating catalyst 28 adsorbs onto the surface of substrate 4. Thereafter, with activating catalyst 28 disposed on the surface of substrate 4, substrate 4 can be exposed to the liquid composition or vapor composition that contain the etchant oxidizer or activatable etchant. According to an embodiment, the etchant oxidizer is produced in the vapor composition from a liquid phase. In a certain embodiment, the activatable etchant is produced in the vapor composition from a liquid phase.

In one embodiment, activating catalyst 28, activatable etchant, etchant oxidizer, or combination thereof is disposed in a liquid or gas (e.g. liquid medium or a vapor composition) that contacts substrate 4 to form etch void 6 therein. Hence, in an embodiment, activating catalyst 28, activatable etchant, and etchant oxidizer contact substrate 4 substantially simultaneously. In a further embodiment, activating catalyst 28, activatable etchant, or etchant oxidizer contact substrate 4 at a different time with respect to contact of substrate 4 by activating catalyst 28, activatable etchant, or etchant oxidizer.

In a certain embodiment, a first liquid medium includes the activatable etchant to provide a first vapor composition, and the second liquid medium includes the etchant oxidizer such that the activatable etchant and etchant oxidizer independently are provided to substrate 4 or activatable catalyst 28. Here, the first vapor composition and the second vapor composition can be synchronously provided to substrate 4 or activating catalyst 28. Alternatively, the first vapor composition and second vapor composition can be asynchronously provided to substrate 4 or activating catalyst 28. A combination of synchronous and asynchronous operation of delivery of the first vapor composition in the second vapor composition to substrate 4 or activating catalyst 28 is contemplated.

It is contemplated vapor composition 42 etches substrate 4 to form article 2 having simple, complex, or combination thereof one-dimensional, two-dimensional or three-dimensional nano-sized or micro-sized etch voids 6 in substrate 4 (e.g., silicon) a presence of activating catalysts 28 such as Ag, Au, Pt, Pd, and the like. Vapor composition 42 includes, in an embodiment, activatable etchant (e.g., hydrofluoric acid (HF)) and etchant oxidizer (e.g., hydrogen peroxide ($H_2O_2$)). Activating catalyst 28 is deposited or patterned on a surface of the silicon substrate and exposed to HF and $H_2O_2$ vapor. Independently changing a partial pressure of HF and $H_2O_2$, activating catalyst shape, substrate temperature, and pressure provide control over the redox reaction and etch rate of the silicon substrate. The etch rate, feature resolution, and etch path of activating catalyst 28 can be controlled to form one-dimensional, two-dimensional, or three-dimensional etch voids 6 with an aspect ratio from 1:1 to greater than 500:1 and etch void 6 resolution on the order of 100 nanometers (nm), specifically 20 nm, more specifically 10 nm, and yet more specifically 1 nm. In an embodiment, vapor composition 42 provides high feature resolution and three-dimensional nanofabrication for formation of article 2. According to an embodiment, using the vapor composition to form etch void 6 in substrate 4 to produce article 2 eliminates fluid flow and fluid-based processes that reposition activating catalyst 28 on the surface of substrate 4 that would otherwise degrade resolution and intended migration path of activating catalyst 28 and substrate four. Consequently, vapor composition 42 provides control over etching path and etching length and reduces stop-lag periods, i.e., a time interval between removal of activatable etchant 28 and when etching of substrate 4 terminates.

In an embodiment, etching substrate 4 is accomplished using vapor composition 42 to form etch voids 6 etch void 6 can have a one-dimensional, two-dimensional, or three-dimensional structure in substrate 4 such as silicon or other III-IV-V semiconductors using patterned or deposited activating catalysts 28 on substrate 4 followed by exposure to vapor composition including the activatable etchant (e.g., HF) or oxidizing agent such as $H_2O_2$. It is contemplated that etching path (i.e., motion of activating catalyst in substrate 40) is controlled by selection of the shape of activating catalyst 28; application of an external fields (e.g., a magnetic field, electric field, or combination thereof); adjustment of concentration (e.g., partial pressure) of activatable etchant, etchant oxidizer, or combination thereof (e.g., HF or $H_2O_2$); and the like. Resolution of etch void 6 during the etching and of etch void 6 is controlled by adjusting activating catalysts 28 identity (i.e., metallic species), shape, composition, and the like; adjusting concentration of the activatable etchant; adjusting concentration of the etchant oxidizer; adjusting total pressure of gases present; and the like. According to an embodiment, etching is controllable and can be started or stopped quickly (e.g., within milliseconds) respectively by introducing or removing the activatable etchant or etchant oxidizer. The activatable etchant or etchant oxidizer partial pressures can be controlled independently by a gas or bubbler system (e.g., with a mass flow controller), concentrations of the activatable etchant or etchant oxidizer, temperature of a reservoir containing the activatable etchant or etchant oxidizer.

In some embodiments, the etching rate, etching time, etching feature resolution, etching path, or etch profile independently are controlled dynamically by changing the activatable etchant or etchant oxidizer partial pressure, by adjusting a temperature of substrate 4; and the like. Substrate 4 can be disposed in a chamber for etching. Substrate 4 can be in a same chamber as the activatable etchant or etchant oxidizer or in a different chamber as the activatable etchant or etchant oxidizer. Further, substrate 4 can be oriented in a horizontal, vertical, upside-down (i.e., inverted), or at an arbitrary angle with respect to earth's surface during etching.

Although conventional etching technology can be expensive with existing technology, etching substrate 4 with vapor composition 42 provides ultra-fine resolutions (e.g., nanometer resolution) at aspect ratios greater than 500:1. Moreover, since vapor is used, fluid flow over substrate 4 does not occur such that the catalyst is not repositioned on the surface of substrate 4 before ethching starts. As a result, etching with vapor composition is repeatable and scalable to large substrates 4. Since vapor composition 42 eliminates fluid flow over substrate 4, entire wafers can be etched in a repeatable manner, and precise introduction or removal of vapor composition 42 provides control over etch time and etch depth. Additionally, since vapor composition 42 eliminates fluid flow, a plurality of wafers can be processed in a single chamber or a plurality of chambers. Drying substrate 4 after etching may be skipped for use of vapor composition 42. Also, dense, high aspect ratio structures can be fabricated without collapsing under capillary forces, and etching processes with vapor composition 42 is suitable for large volume manufacturing.

In some embodiment, a system for controlling (e.g., adjusting) a temperature of substrate 4 controls an etch rate of substrate 4. Controlling the temperature of substrate 4 can be used to control a phase of etch adsorbant 52. In an embodiment, the temperature is controlled during the etch period to control a parameter such as etch rate, feature resolution, etch structure, etch shape, and the like.

Figure 17:
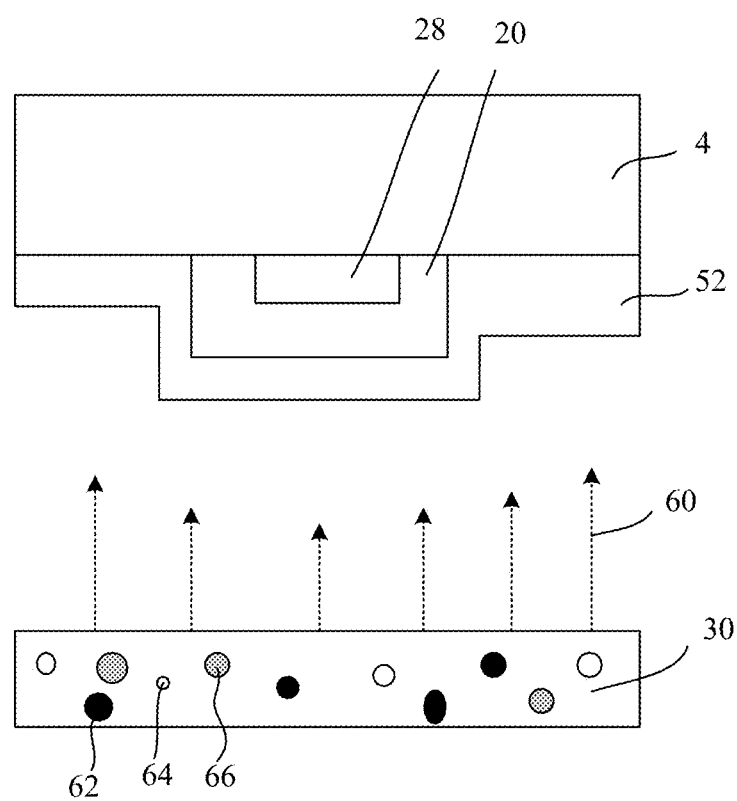
FIG. 17 shows formation of a deposit disposed on a substrate.
Figure 18A:
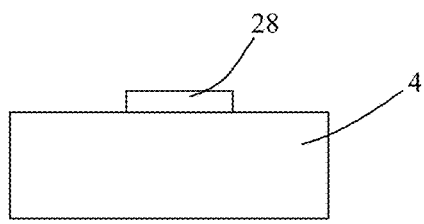
FIGS. 18A, 18 B, 18 C, 18 D, 18E, and 18F show formation of a deposit disposed on a substrate and secondary substrate.
Figure 18B:
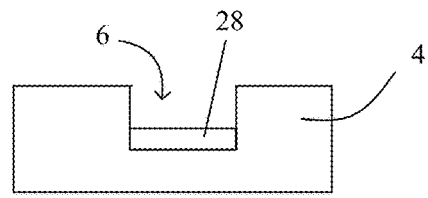
Figure 18C:
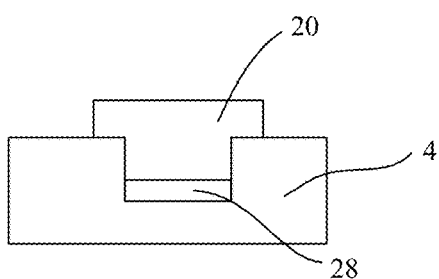
Figure 18D:
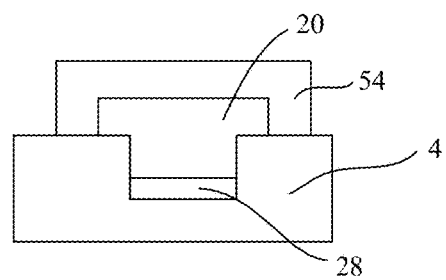
Figure 18E:
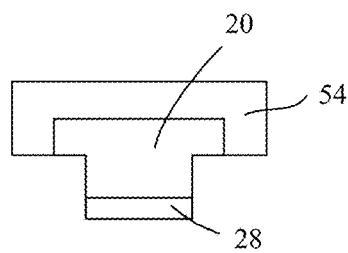
Figure 18F:
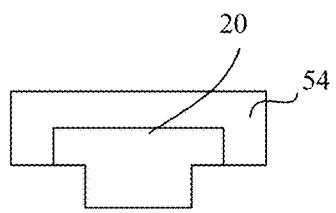
Figure 19A:
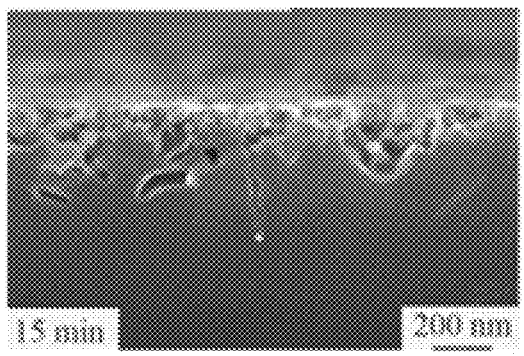
FIGS. 19A, 19B, 19C, and 19D show micrographs of etch voids disposed in a substrate according to Example 1.
Figure 19B:
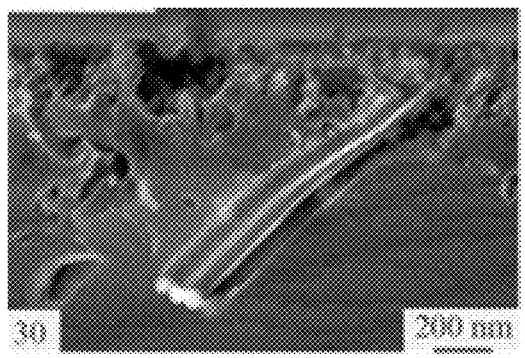
Figure 19C:
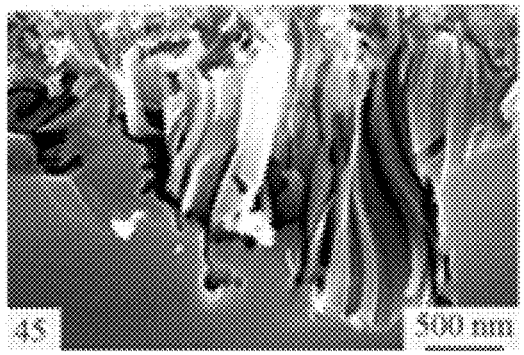
Figure 19D:
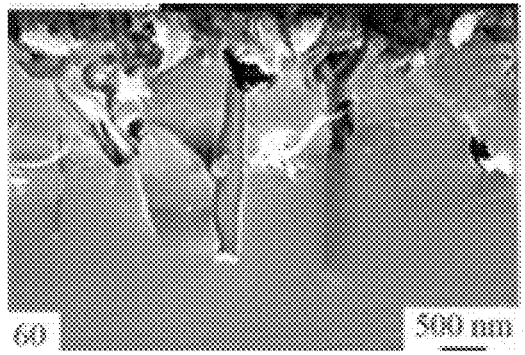
Figure 20A:
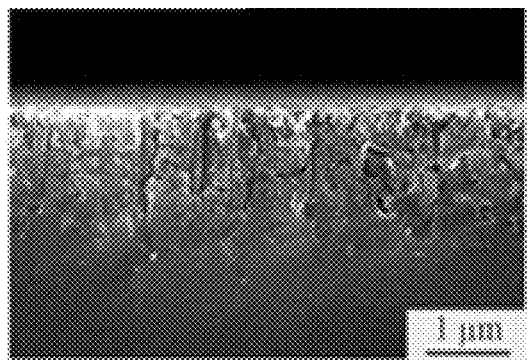
FIGS. 20A, 20B, 20C, and 20D show micrographs of etch voids disposed in a substrate according to Example 1.
Figure 20B:
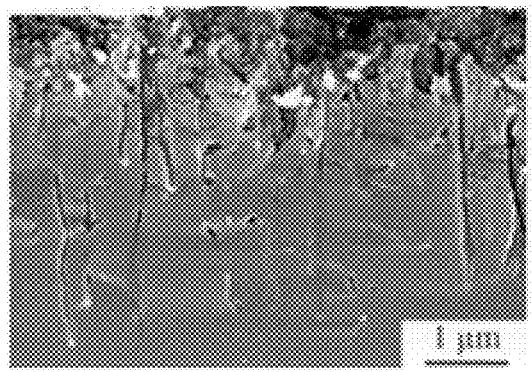
Figure 20C:
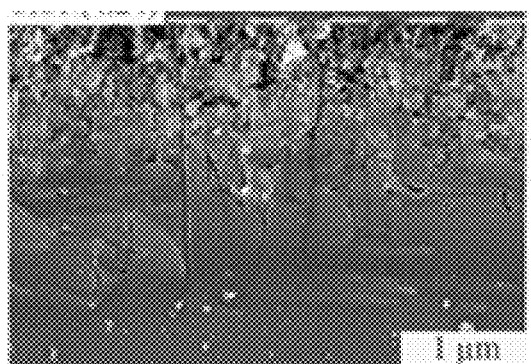
Figure 20D:
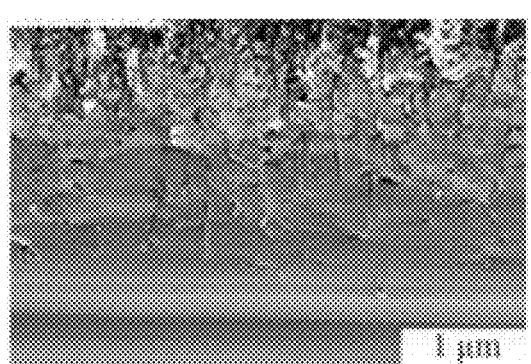
Figure 21A:
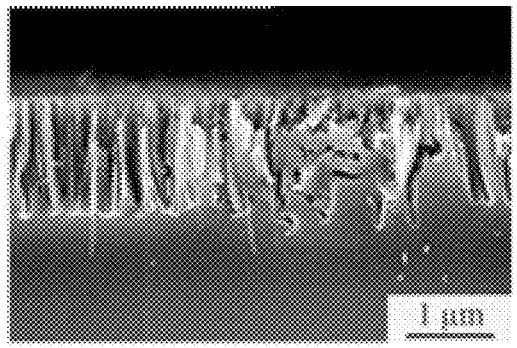
FIGS. 21A, 21B, 21C, and 21D show micrographs of etch voids disposed in a substrate according to Example 1.
Figure 21B:
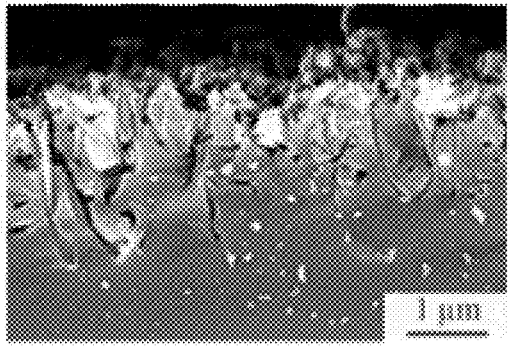
Figure 21C:
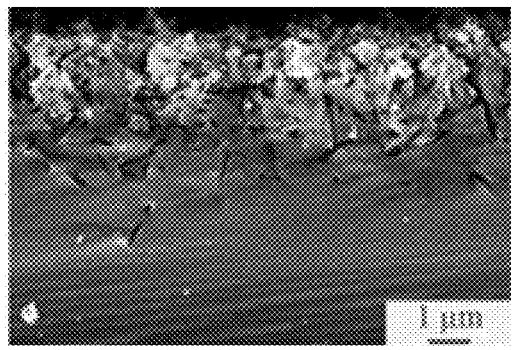
Figure 21D:
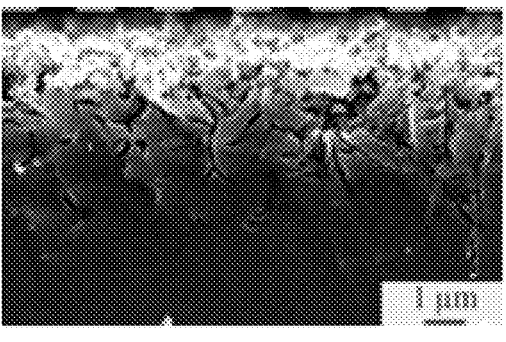

Etching removes material from substrate 4 and can also form a structured element (e.g., etch void 6, microporous layer, dendritic vein 24, and the like) in substrate 4. Herein, etching substrate 4 includes etching using a condensed medium (e.g., liquid medium 30) or vapor phase (e.g., vapor composition 42). In an embodiment, activating catalyst 28 is used for deposition of a material on substrate 4 to form deposit 20. With reference to FIG. 17, a process for depositing a metal includes disposing activating catalyst on substrate 4; contacting activating catalyst 28 with metal cation 64 from vapor deposition composition 60; contacting substrate 4 with reducing anion 66 from vapor deposition composition 60; performing an oxidation-reduction reaction between metal cation 64 and reducing anion 66 in a presence of activating catalyst 28 on substrate 4; and forming metal 20 from metal cation 64 to deposit metal 20 on substrate 4. Here, vapor deposition composition 60 adsorbs onto substrate 4 as deposition adsorbent 52 that includes an appreciable number density of metal cation 64 and reducing anion 66 effective to form metal 20.

In some embodiments, the process for depositing metal 20 includes forming vapor deposition composition 60 by combining metal cation 64 from a first source and reducing anion 66 from a second source and providing vapor deposition composition 60 to substrate 4 and activating catalyst 28. Here, providing vapor deposition composition 60 to substrate 4 and activating catalyst 28 is for contacting activating catalyst 28 with metal cation 64 and contacting substrate 4 with reducing anion 66.

In some embodiments, the process for depositing metal 20 includes forming vapor deposition composition 60 that includes metal cation 64 and reducing anion 66 and providing vapor deposition composition 60 to substrate 4 and activating catalyst 28. Here, providing vapor deposition composition 60 to substrate 4 and activating catalyst 28 is for contacting activating catalyst 28 with metal cation 64 and contacting substrate 4 with reducing anion 66.

According to an embodiment, the process for depositing metal 20 includes further includes dissociating primary reagent 62 to form metal cation 64 and reducing anion 66; forming metal cation 64 and reducing anion 66 in a liquid state (e.g., liquid medium 30) in response to dissociating primary reagent 62, and volatilizing metal cation 64, reducing anion 66, or a combination thereof to form vapor deposition composition 60. Primary reagent 62 can be disposed in a solvent to dissociate primary agent 62. The process can include heating primary agent 62 to dissociate primary agent 62 to provide metal cation 64 or reducing anion 66.

In an embodiment, the process also includes growing a structure on the substrate by forming the metal. The structure can include metal 20. Exemplary structures include protrusions, electrodes, mirrors, gratings, and the like.

In some embodiments, the process includes etching substrate 4 prior to forming metal 20 on substrate 4. With reference to FIGS. 18A, 18B, 18C, 18D, 18E, and 18F, activating catalyst 28 is disposed on substrate 4 (FIG. 18A), substrate 4 is subjected to etching to form etch void 6 (FIG. 18B), metal 20 is formed on substrate 4 (FIG. 18C), forming secondary substrate 54 (e.g., a semiconductor, metal, or polymer such as plastic) on metal 20 (by e.g., deposition) (FIG. 18D), removing substrate 4 from metal 20 (FIG. 18E, and removing activating catalyst 28 from metal 20 to form an article having metal 20 (grown by using vapor deposition composition 60 on substrate 4 and activating catalyst 28) disposed on secondary substrate 54.

In an embodiment, the process includes etching substrate 4 and depositing metal 20 on substrate 4 concurrently.

In a certain embodiment, the process for forming metal 20 on substrate 4 includes etching substrate 4 by providing vapor composition 42 that includes the etchant oxidizer, activatable etchant, or a combination thereof; contacting activating catalyst 28 with the etchant oxidizer, contacting substrate 4 with the activatable etchant; performing an oxidation-reduction reaction between substrate 4, the activatable etchant, and the etchant oxidizer in a presence of activating catalyst 28 and vapor composition 42; forming etchant product 32 that includes a plurality of atoms from substrate 4; removing etchant product 32 from substrate 4 to etch the substrate; and then forming metal 20 on substrate 4.

In an embodiment, the process for forming metal 20 on substrate 4 includes etching substrate 4 by providing liquid medium 30 that includes the activatable enchant, etchant oxidizer, or combination thereof; performing an oxidation-reduction reaction between substrate 4, activatable etchant, and etchant oxidizer in a presence of activating catalyst 28, wherein the oxidation-reduction reaction occurs in a presence of liquid medium 30; forming etchant product 32 that includes a plurality of atoms from substrate 4; and removing a portion of etchant product 32 from substrate 4 to etch substrate 4.

According to an embodiment, the process for forming metal 20 on substrate 4 further includes terminating forming metal 20, e.g., by quenching the growth of metal 20. Forming metal 20 also can include forming a plurality of layers comprising metal 20 on substrate 4, e.g., in a laminar structure or different layers on different portions of substrate 4. In an embodiment that includes etching substrate 4 and forming metal 20 on substrate 4, the process can include filling a void (that may be the same or different than etch void 6) in substrate 4, e.g., with metal 20 formed by depositing metal 20 using vapor deposition composition 60 in combination with activating catalyst 28. In some embodiments, the void is different than etch void 6 and is a crack disposed in substrate 4. It is contemplated that in certain embodiments metal cation 64 includes a plurality of different metal cations 64, and metal 20 deposited on substrate 4 includes an alloy (e.g., Au—Pt, W—Rh, and the like. Further, primary agent 62 can include the metal salt, organometallic compound, and the like, or combination thereof.

In an embodiment, a system for depositing metal 20 on substrate 4 includes activating catalyst 28 to deposit on substrate 4 and primary reagent 62. Primary reagent 62 is provided to form metal cation 64 to deposit on substrate 4 as metal 20 and reducing anion 66 to provide electrons to activating catalyst 28, metal cation 64, substrate 4, or a combination thereof. Here, primary reagent 62 forms metal cation 64 and reducing anion 66 in response to being subjected to a dissociating condition, e.g., heating, solvation, a kinetic or thermodynamic process (e.g., kinetic or thermodynamic equilibria), and the like.

Using vapor deposition composition 60 to form metal 20 on substrate 4 provides a plurality of chemical precursors for low temperature chemical vapor deposition (CVD) of metal 20. While conventional CVD processes for forming a metal may use an expensive organic precursor or involve a harsh chemical environment (e.g., high temperature, high-energy plasma, highly reactive reducing agents such as $H_2$), forming metal 20 on substrate 4 herein does not. Moreover, deposition processes herein reduce the cost of metal 20 formation that forms at low temperatures (e.g., less than 100° C.) with inexpensive chemicals and in an absence of high-energy plasmas. It is contemplated that deposition processes herein include a vapor phase electroless deposition to selectively deposit metal 20 on a plurality of different substrates 4 to form a conformal coating, to fill a via, to fabricate a one-dimensional, two-dimensional, or three-dimensional nanostructure on substrate 4. Further, metal 20 is disposed on substrate 4 in topside or backside metallization, e.g., for microelectronic devices, MicroElectroMechanical Systems (MEMS), photonics, advanced communication devices, and the like.

It has surprisingly been found that vapor deposition composition 60 from liquid medium 30 that includes, e.g., primary reagent 62 (e.g., a metal salt (for metal cationic 64) and reducing anion 66 adsorbs as deposition adsorbant 52 on substrate 4. Deposition adsorbent 52 includes a thin, condensed layer including, e.g., metal cation 64, reducing anion 66, and water in some embodiments. Metal ions 64 is reduced catalytically on activating catalyst 28 to form solid metal 20. This process can be used to fill vias and blind vias from a bottom up.

Using vapor deposition composition 60 that includes metal cation 64 to form metal 20 on substrate 4 as numerous advantages such as deposition occurring at a low temperature, in a benign chemical environment, with chemical precursors that are cheap and readily available, and in a reaction chamber to decrease cost lower than convention CVD chambers. Further, such deposition method for metal 20 is site selective deposition with respect to a selected portion of substrate 20, can fill ultra-small openings, is not sensitive to a wetting property of substrate 4, void-free filling for micro-via applications, forms three-dimensional metallic nanostructures, works for a wide range of different primary reagents 62, amenable to deposit pure metals or alloys, amenable to produce carbon-free metal 20, and the like.

According to an embodiment, vapor deposition composition 60 that includes metal cation 64 to form metal 20 on substrate 4 provides deposition of zero-dimensional, one-dimensional, two-dimensional, or three-dimensional structures of metal 20 on substrate 4; deposition of zero-dimensional, one-dimensional, two-dimensional, or three-dimensional structures of metal 20 that includes an oxide of the metal, deposition of zero-dimensional, one-dimensional, two-dimensional, or three-dimensional structures of metal 20 composite structures of metal 20 (e.g., metal in combination with a filler such as nanoparticles, e.g., nanotubes) or alloys of the metal; and the like.

In an embodiment, vapor deposition composition 60 that includes metal cation 64 to form metal 20 on substrate 4 provides selection of primary reagent 62 or activating catalyst 28 to deposit pure metals or alloys for metal 20. Further, metal 20 can be formed with a selected size, e.g., less than 1 nm in size and can fill a via from the bottom up, form in a micro-via or nano-via, fabricate a photonic structure, fabricate an antenna (e.g., for communications equipment), fabricate a circuit path for an electronic article, fabricate a magnetic structure (e.g., for a microelectronics device or process), and the like. Additionally, processes for forming metal 20 can be controlled such as independently regulating a flow rate or vapor pressure, pre-heating temperature, concentration, or deposition rate of deposition composition 60 and its components (e.g., 64, 66), and the like. In this manner, the process provides control of morphology, crystallinity, grain size, thickness, deposition rate, precursor composition, and the like of metal 20 on substrate 4. It is contemplated that the deposition of metal 20 on substrate 4 can be used to make lenses with high-Z metals (high atomic number) or filling defects in substrates such as cracks in ship hulls or bridges where the substrate is a metal that may have been subject to stress fracture or corrosion. Further, such deposition is useful for producing devices and article for microelectronics, microelectromechanical systems (MEMS), microfluidics, bioactive substrates, bioremediation, and the like.

It is contemplated that in processes herein, substrate 4 is a semiconductor material that includes an element from group III, group IV, group V of the periodic table, or a combination comprising at least one of the foregoing elements. Activating catalyst 28 can include a plurality of metal catalysts, e.g., different metal catalysts. The plurality of metal catalysts can include a plurality of different shapes, different sizes, or combination comprising at least one of the foregoing shapes or sizes. In some embodiments, the plurality of metal catalysts comprises gold, platinum, palladium, tungsten, silver, or combination comprising at least one of the foregoing. It is contemplated that the etchant oxidizer includes an oxidant that is reduced by activating catalyst 28, and the activatable etchant includes a reducing compound that is oxidized by substrate 4.

With reference to coating 22, the plurality of dendritic veins 24 are hollow in some embodiments. Coating 22 can be an antireflective coating that has a reflectivity tuned from 10% to 0.01% at a wavelength from 30 nm to 1 cm. Additionally, coating 22 can be an antireflective coating that is a broadband antireflective coating being antireflective to a wavelength from 30 nm to 1 cm. The gradient in the density of the volume of coating 22 can be a uniform gradient in the density of the volume, and coating 22 can have a gradient in an index of refraction. The gradient in the index of refraction can be a uniform gradient that varies from 1 to 3.9. Furthermore, a temperature of substrate 4 during the oxidation-reduction reaction can be less than 150° C.

In some embodiments of forming metal 20 on substrate 4, a melting point of primary reagent 62 can be less than 500° C., specifically less than 250° C., and more specifically less than room temperature. While primary reagent 62 dissociates to provide metal cation 64 and reducing anion 66, primary reagent 62 has high thermal stability with respect to decomposition to form a decomposition product that is different than dissociation products such as metal cation 64 and reducing anion 64. That is, primary reagent 62 withstands prolonged heating (several hours or even days) at a temperature of 100° C. and greater, e.g., 300° C., without significant thermal decomposition. Primary reagent produces metal cation 64 and reducing agent 66 that independently have a sufficient volatility to form vapor deposition composition 60 so that metal cation 64 will exit liquid medium 30, enter a vapor phase in vapor deposition composition 60, and contact substrate 4 or activating catalyst 28. Primary reagent 62 can be air-stable or can have a limited sensitivity for air or moisture.

The articles and processes herein are illustrated further by the following Examples, which are non-limiting.

EXAMPLES

Example 1. Production of Etch Voids

Producing etch voids in a silicon substrate was investigated. We researched an etch rate of Ag, Au, and Pd/Au catalysts at one etchant composition. The etching process did not form a layer of meso/microporous silicon preceding disposition of the metal catalyst on the substrate. We found that the catalyst travelled through a three-dimensional volume in the substrate and formed helical-shaped etch voids therein.

Samples were prepared from p-type, 100-mm diameter (100) silicon wafers used with an as-manufactured stated resistivity of 5-10 Ωcm. Ag, Au, and Pd/Au (40/60 atomic percent) were deposited on separate wafers using an electron beam evaporator for a target thickness of 2.3-3.0 nm at a deposition rate of 0.15 nm/s and then 1 cm×1 cm samples were scribed from the larger wafer. Immediately prior to etching, samples were cleaned with an $O_2$ plasma or a piranha mixture of 3:1 sulfuric acid:$H_2O_2$.

Samples were etched with the vapor coming from a $\rho=70^{12.8}$ etchant solution made with 16 mL of 48 wt % 1-HF and 18.4 mL of 30 wt % $H_2O_2$. Note that $\rho^x$ is used to denote the etchant composition where $\rho^x=([HF]/([HF]+[H_2O_2]))^{x=[HF]}$ and x is the HF concentration in units of moles/liter. The etchant was held at mom temperature (≈27° C.), and the samples were held approximately 25 mm above the etchant by use of an HF-compatible static chuck with substrate temperature control.

To evaluate the etch rate as a function of time, samples were etched at 40° C. for different times (15 min, 30 min, 45 min, or 60 min). To evaluate the influence of temperature, Au catalysts were used as the substrate was exposed for etching for 15 min at 35° C., 40° C., 45° C., 50° C., 55° C., or 60° C. Formation of microporous silicon using a vapor composition (as etchant) versus using a liquid medium (as etchant) was studied by comparing samples etched with the vapor composition at 35° C. held in the static chuck with samples held at room temperature above the solution. The sample held at room temperature forms a thicker condensed liquid layer that is visible to the eye. Ag catalyst dissolution and re-deposition was confirmed by using electron-beam lithography to pattern Ag and Au catalysts that were approximately 65 nm thick.

Top-down and cross-section images of the samples were taken using the In-Lens detector of a Ziess LEO 1525 Thermally-Assisted Scanning Electron Microscope (SEM) to determine etch depth, etch rate, hole morphology, and microporous silicon generation.

Silicon coated with metal catalysts and exposed to a vapor mixture of HF and $H_2O_2$ exhibited etching confined to a 1-2 nm region surrounding the catalyst with the etching process propagated by catalyst motion through three-dimensional space. Scanning electron microscope (SEM) micrographs of samples are shown in FIGS. 19A, 19B, 19C, and 19D for vapor composition etching of Si with Ag catalyst that respectively were etched for 15 min (19A), 30 min (19B), 45 min (19C), and 60 min (19D).

Similarly, FIGS. 20A, 20B, 20C, and 20D show scanning electron microscope (SEM) micrographs of samples for vapor composition etching of Si with Au catalyst that respectively were etched for 15 min (20A), 30 min (20B), 45 min (20C), and 60 min (20D).

Additionally, FIGS. 21A, 21B, 21C, and 21D show scanning electron microscope (SEM) micrographs of samples for vapor composition etching of Si with Pd/Au catalyst that respectively were etched for 15 min (21A), 30 min (21B), 45 min (21C), and 60 min (21D).

Catalysts randomly etched through three-dimensional volumes with six degrees of freedom. Catalysts were observed over a wide range of depths within a single sample, and a small percentage of the catalyst particles etched perpendicular to the catalyst surface over an entire etch time. A large proportion of catalysts remained within a top 1-2 μm of the surface of the sample.

Figure 22:
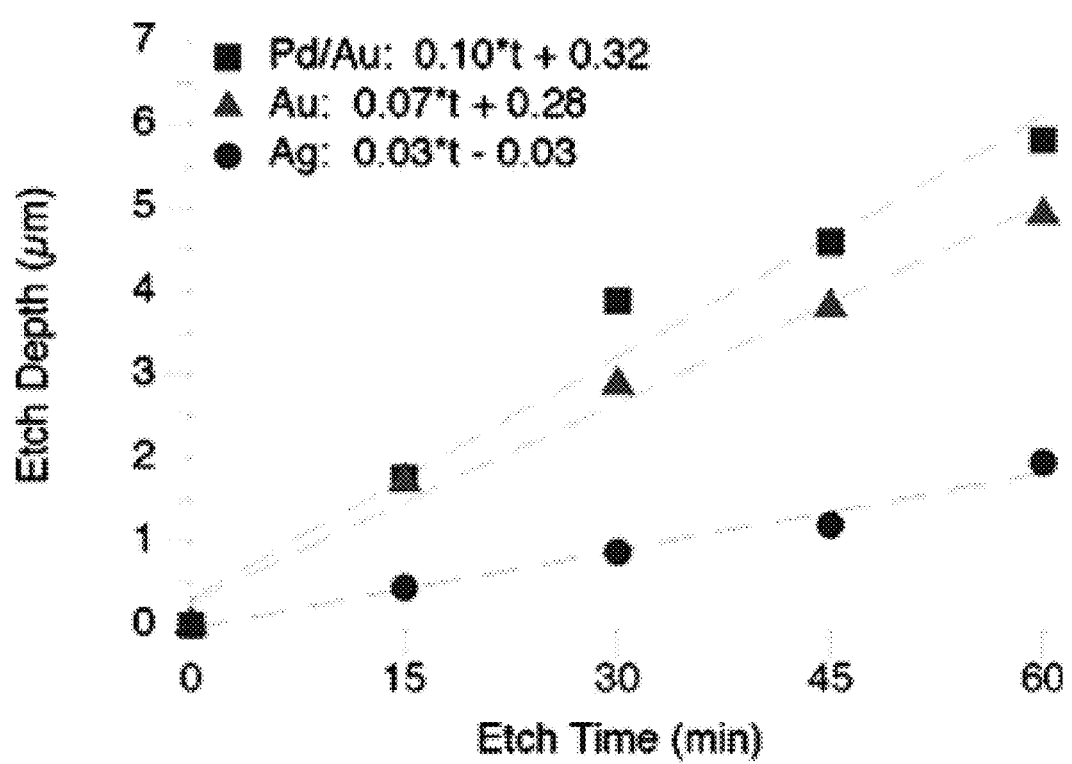
FIG. 22 shows a graph of etch depth versus etch time for data according to Example 1, Example 2, and Example 1.
Figure 23A:
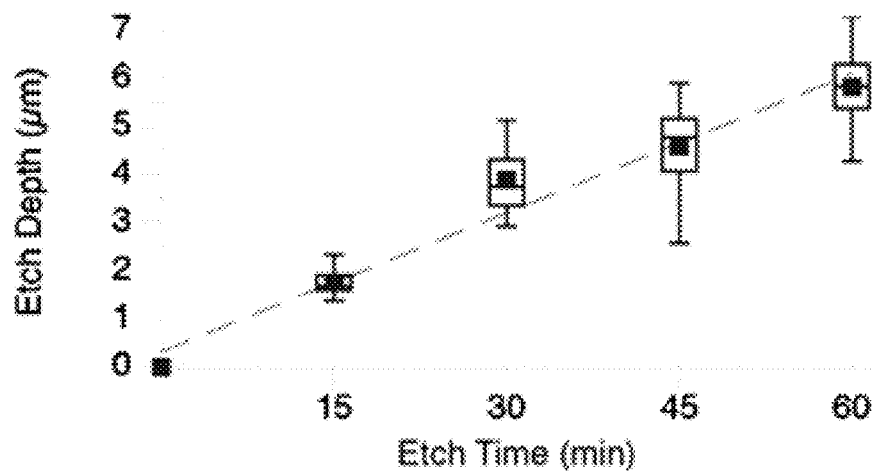
FIGS. 23A, 23B, and 23C show graphs of etch depth versus etch time for data according to Example 1, Example 2, and Example 1.
Figure 23B:
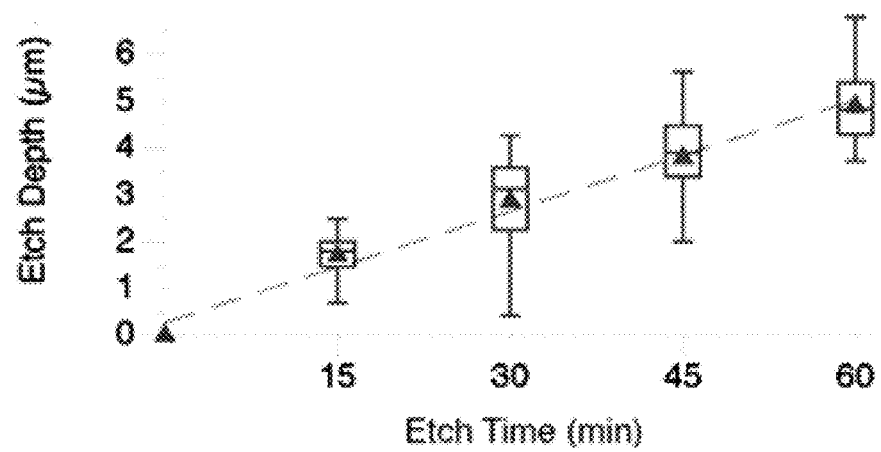
Figure 23C:
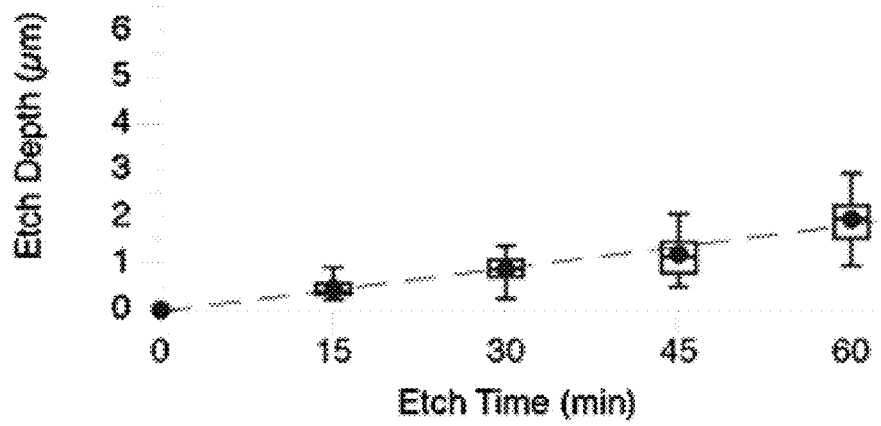

FIG. 22 shows a graph of etch depth versus etch time for a mean observed etch depth for the three catalysts studied and a linear fit used to estimate an average etch rate for each catalyst. FIGS. 23A, 23B, and 23C show graphs of etch depth versus etch time for a distribution of where catalyst particles were observed and also show fits from FIG. 22. A wide distribution of observed etch depth was attributed to catalyst particles etching through a three-dimensional volume in a random direction. Etch depth data and rate data are summarized in TABLE 1. Etching was absent in areas of sample that did not having disposed catalyst.

TABLE 1

| Catalyst | Mean/Max Etch Depth [μm] | | | | Mean/Max Etch Rate [nm/min] |
| --- | --- | --- | --- | --- | --- |
| | 15 min | 30 min | 45 min | 60 min | |
| Ag | 0.45/0.91 | 0.87/1.37 | 1.20/2.08 | 1.94/3.30 | 31/52 |
| Au | 1.72/2.50 | 2.88/3.17 | 3.81/4.24 | 4.91/6.81 | 70/110 |
| Pd/Au | 1.75/2.53 | 3.88/4.90 | 4.58/5.90 | 5.81/7.27 | 96/120 |

The metal catalyst propagated the etching reaction. For the liquid medium (4:1.3:2.7 $HF:H_2O_2:H_2O$), Ag, Au, and Pd catalysts etched at 0.3, 5.0, and >30 μm/min in a $\rho=90^{13.8}$ such that etch rate was proportional with the catalytic activity of the metal. For the vapor composition, etch rates of Ag, Au, and Pd/Au were 0.03, 0.07, and 0.10 μm/min.

Figure 24:
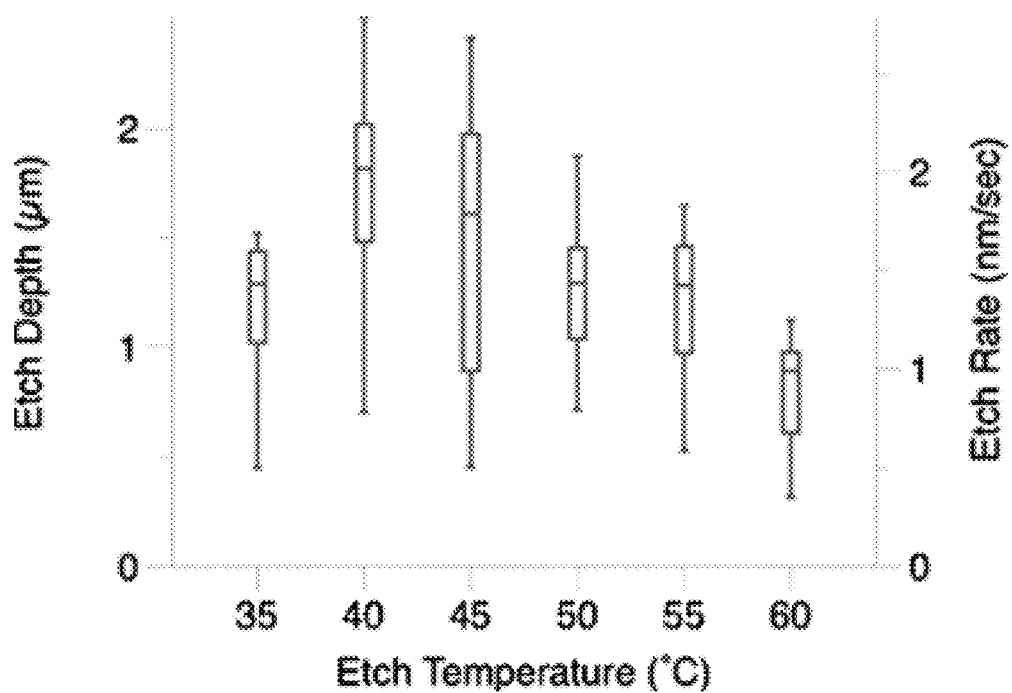
FIG. 24 shows a graph of etch depth and etch rate versus etch temperature according to Example 1.

The etch rate of the vapor composition depended on substrate temperature. The etch depth and rate data for Au catalyst samples etched for 15 minutes at substrate temperatures from 35° C. to 60° C. above a $\rho=70^{12.8}$ solution are shown in FIG. 24 as a graph of etch depth and etch rate versus etch temperature. The maximum etch rate occurred at a temperature of 40° C.

Example 2. Catalyst Motion

Figure 25:
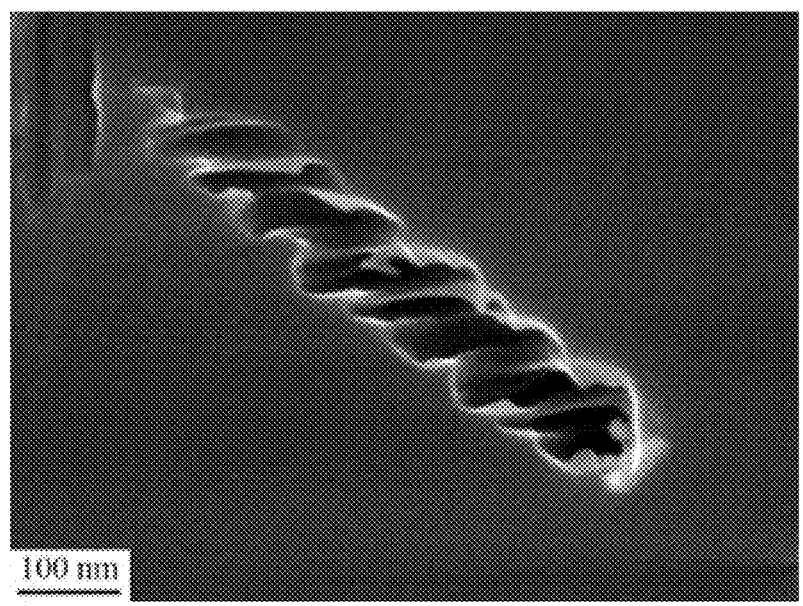
FIG. 25 shows a micrograph of an etch void in a substrate according to Example 2.

The motion of the catalyst during the vapor composition etching of the samples according to Example 1 was studied. Catalysts travelled through three-dimensional volumes during the etching process, as exemplified by the helical structure shown in FIG. 25. Accordingly, the vapor composition etching of the samples showed that the vapor composition formed complex structures without stiction issues. It is believed that catalyst motion during etch could be controlled to etch solely in a vertical dimension by adjusting the HF and $H_2O_2$ concentrations within the incoming vapor or adjusting the catalyst shape and particle-to-particle spacing. The feature resolution in FIG. 25 was high, and a shape of the etch void matched a shape of the catalyst.

Example 3. Microporous Silicon

For the studies described in Example 1, formation of micro- and mesoporous silicon during etching was considered. While liquid medium etching produced microporous silicon, the vapor composition etched the samples but did not generate micro/mesoporous. FIGS. 26A and 26B shows micrographs for the etched samples using the liquid medium, and FIGS. 27A and 27B shows micrographs for the etched samples using the vapor composition. Both sets of data was for the Pd/Au catalyst. The light grey/white areas surrounding the metal catalysts (bright white) indicated the formation of microporous silicon in FIGS. 26A and 26B for the liquid medium etching. These light-grey areas were missing in the samples etched by the vapor composition as shown in FIGS. 27A and 27B, which indicated that the vapor composition etching did not generate microporous silicon. Both of these samples consisted of 2.3 nm of Pd/Au deposited at the same time in an e-beam evaporator, then etched above the same $\rho=70^{12.8}$ mixture. The liquid medium etching was conducted by leaving the substrate at room temperature (~27° C.) to create a condensed layer on the substrate that is thick enough to slightly bead up on the surface. This thickly condensed layer had a similar etchant composition and concentration as compared to the vapor composition etching, yet resulted in a different morphology. The light grey areas surrounding the metal catalyst in FIGS. 26A and 26B were indicative of micro/mesoporous silicon generation, establishing that the liquid medium etching with a Pd/Au catalyst generated micro/mesoporous silicon even for extremely dilute etchant compositions. However, increasing the substrate temperature reduced the condensed phase thickness to 1-2 nm, while maintaining the same etchant composition. As shown in FIGS. 27A and 27B, these samples did not have micro/mesoporous silicon.

Example 4. Vapor Deposition

Figure 28A:
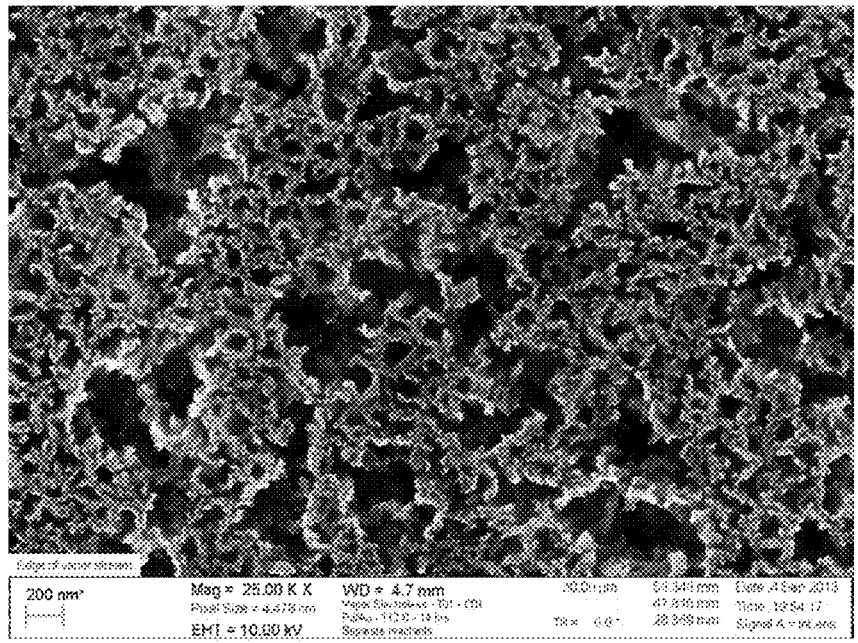
FIGS. 28A and 28B respectively show a micrograph of an etch void in a substrate and a deposit on the etch void according to Example 4.
Figure 28B:
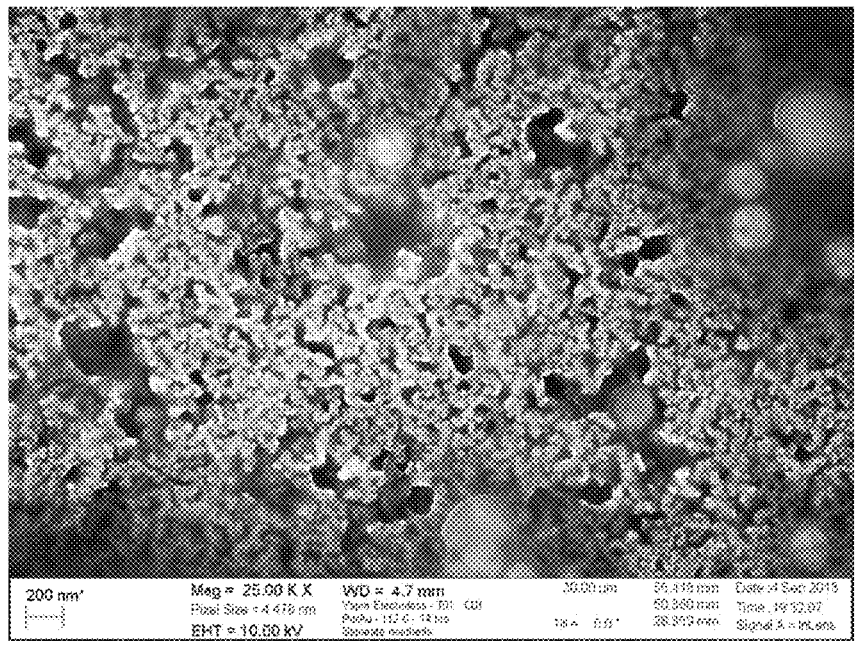
Figure 29A:
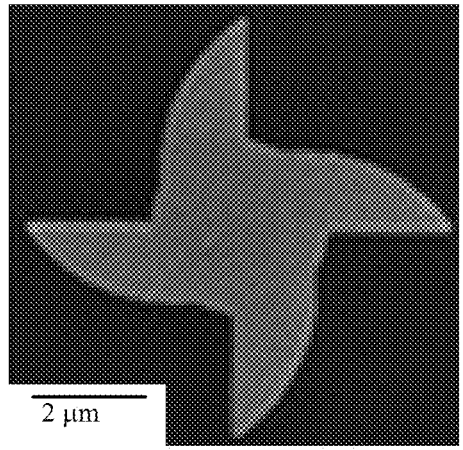
FIGS. 29A, 29B, 29C, and 29D show a micrograph of formation of a deposit according to Example 5.
Figure 29B:
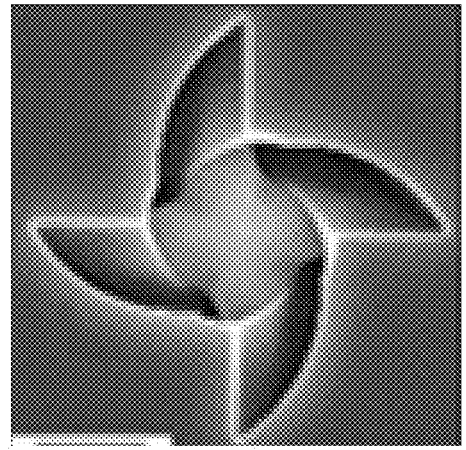
Figure 29C:
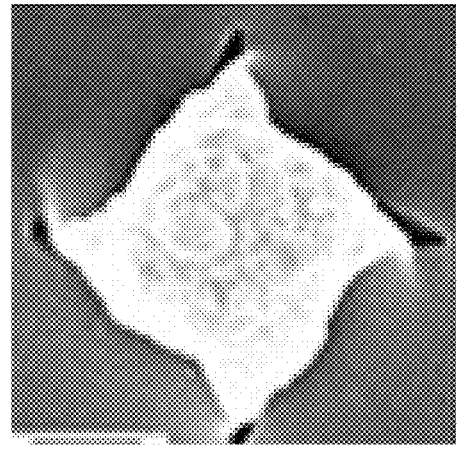
Figure 29D:
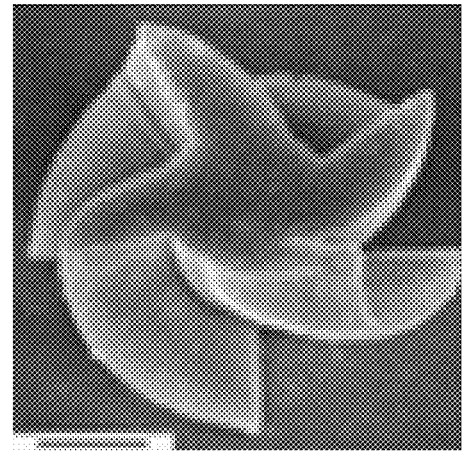

FIGS. 28A and B show before and after scanning electron microscope images of a structure etched using vapor-phase metal-assisted chemical etching followed by vapor phase deposition of metal. FIG. 28A shows the etch wafer of silicon with etch voids across the surface. FIG. 28B shows nickel deposited into these voids by to fill the voids and cover the surface. The nickel appeared as bright white with small cracks in the surface caused when nickel depositions from neighboring voids met. Etching confined the nickel deposit to narrow locations where catalyst was present, which increased ease of identification of locations where nickel deposited.

Example 5. Forming Etch Void and Forming Metal in Etch Void

A complex shape is fabricated in an substrate using a catalyst with a complex shape. With reference to FIGS. 29A, 29B, 29C, and 29D, a "star" shaped catalyst is fabricated using electron beam lithography and electron beam deposition. The catalyst is composed of two layers, a first layer of Ti and a second layer of Au. The substrate and catalyst are immersed in a $\rho=90^{[13.8]}$ etchant solution at room temperature for a few minutes. The resulting etch void is shaped like a spiraling star. The catalyst is left in a bottom of the etch void and is a whitish region in a center of the void. The spiraling structure rotates counter-clockwise as shown by "shadows" in the scanning electron microscope image. Varying the shape of the catalyst, composition of the etchant, and phase of the etchant affects the shape of the etch void.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A process for depositing a metal, the process comprising:
   disposing an activating catalyst on a substrate;
   providing a vapor deposition composition, the vapor deposition composition separately comprising:
      a plurality of metal cations; and
      a plurality of reducing anions,
      such that the metal cations and the reducing anions are dissociated from one another in the vapor deposition composition, and
      the vapor deposition composition is provided in a gaseous state to the substrate;
   contacting the activating catalyst with a metal cation from the vapor deposition composition;
   contacting the substrate with a reducing anion from the vapor deposition composition;
   performing an oxidation-reduction reaction between the metal cation and the reducing anion in a presence of the activating catalyst; and
   forming a metal from the metal cation to deposit the metal on the substrate.

2. The process of claim 1, further comprising:
   forming the vapor deposition composition by combining:
      the metal cation from a first source; and
      the reducing anion from a second source; and
   providing the vapor deposition composition to the substrate and the activating catalyst for:
      contacting the activating catalyst with the metal cation; and
      contacting the substrate with the reducing anion.

3. The process of claim 1, further comprising:
   forming the vapor deposition composition comprising:
      the metal cation; and
      the reducing anion; and
   providing the vapor deposition composition to the substrate and the activating catalyst for:
      contacting the activating catalyst with the metal cation; and
      contacting the substrate with the reducing anion.

4. The process of claim 3, further comprising:
   dissociating a primary reagent to form the metal cation and the reducing anion;
   forming the metal cation and the reducing anion in a liquid state in response to dissociating the primary reagent; and volatilizing the metal cation and the reducing anion to form the vapor deposition composition.

5. The process of claim 4, further comprising disposing the primary reagent in a solvent to dissociate the primary agent.

6. The process of claim 4, further comprising heating the primary agent to dissociate the primary agent.

7. The process of claim 1, further comprising growing a structure on the substrate by forming the metal.

8. The process of claim 7, wherein the structure comprises the metal.

9. The process of claim 1, further comprising etching the substrate prior to forming the metal on the substrate.

10. The process of claim 9, wherein etching the substrate comprises:
   providing a vapor etching composition comprising an etchant oxidizer, an activatable etchant, or a combination comprising at least one of the foregoing;
   contacting the activating catalyst with the etchant oxidizer;
   contacting the substrate with the activatable etchant;
   performing an oxidation-reduction reaction between the substrate, the activatable etchant, and the etchant oxidizer in a presence of the activating catalyst and the vapor etching composition;
   forming an etchant product comprising a plurality of atoms from the substrate; and
   removing the etchant product from the substrate to etch the substrate.

11. The process of claim 9, wherein etching the substrate comprises:
   providing a liquid medium comprising an activatable enchant, an etchant oxidizer, or a combination comprising at least one of the foregoing;
   performing an oxidation-reduction reaction between the substrate, the activatable etchant, and the etchant oxidizer in a presence of the activating catalyst, the oxidation-reduction reaction occurring in a presence of the liquid medium;
   forming an etchant product comprising a plurality of atoms from the substrate; and
   removing a portion of the etchant product from the substrate to etch the substrate.

12. The process of claim 1, further comprising terminating forming the metal.

13. The process of claim 1, further comprising forming a plurality of layers comprising the metal on the substrate.

14. The process of claim 1, further comprising filling a void in the substrate.

15. The process of claim 14, wherein the void is a crack disposed in the substrate.

16. The process of claim 1, wherein the metal cation comprises a plurality of different metal cations, and the metal deposited on the substrate comprises an alloy.

17. The process of claim 1, wherein the activating catalyst comprises a transition metal element.

18. The process of claim 5, wherein the primary agent comprises a metal salt, an organometallic compound, or a combination comprising at least one of the foregoing.

19. The process of claim 1, wherein a temperature of the substrate is less than 100° C.

* * * * *